United States Patent
Haneda et al.

(10) Patent No.: US 8,067,836 B2
(45) Date of Patent: Nov. 29, 2011

(54) SEMICONDUCTOR DEVICE WITH REDUCED INCREASE IN COPPER FILM RESISTANCE

(75) Inventors: Masaki Haneda, Kawasaki (JP);
Noriyoshi Shimizu, Kawasaki (JP);
Nobuyuki Ohtsuka, Kawasaki (JP);
Yoshiyuki Nakao, Kawasaki (JP);
Michie Sunayama, Kawasaki (JP);
Takahiro Tabira, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 38 days.

(21) Appl. No.: 12/431,944

(22) Filed: Apr. 29, 2009

(65) Prior Publication Data
US 2009/0321937 A1    Dec. 31, 2009

(30) Foreign Application Priority Data
Jun. 25, 2008   (JP) .................................. 2008-165449

(51) Int. Cl.
*H01L 23/48* (2006.01)
*H01L 23/52* (2006.01)
*H01L 29/40* (2006.01)
*H01L 21/4763* (2006.01)
*H01L 21/28* (2006.01)
*H01L 21/44* (2006.01)

(52) U.S. Cl. ......... 257/751; 257/E23.142; 257/E21.409; 257/E21.584; 257/E23.161; 257/E21.577; 257/773; 257/774; 257/680; 257/762; 257/761; 257/758

(58) Field of Classification Search ................. 257/751, 257/E23.142, E21.409, E21.584, E23.161, 257/773, 774, 680, 762, 765, E21.577, 761, 257/758
See application file for complete search history.

(56) References Cited

U.S. PATENT DOCUMENTS

| | | | |
|---|---|---|---|
| 6,664,185 B1 | 12/2003 | Wang et al. | |
| 7,304,384 B2 | 12/2007 | Koike et al. | |
| 7,611,984 B2 * | 11/2009 | Koura et al. | 438/627 |
| 7,855,147 B1 * | 12/2010 | Dulkin et al. | 438/676 |
| 2005/0218519 A1 * | 10/2005 | Koike et al. | 257/756 |
| 2006/0270233 A1 * | 11/2006 | Xia et al. | 438/690 |
| 2007/0020931 A1 * | 1/2007 | Koura et al. | 438/687 |
| 2008/0265417 A1 * | 10/2008 | Kawamura et al. | 257/751 |
| 2010/0007023 A1 | 1/2010 | Koura et al. | |
| 2010/0009530 A1 * | 1/2010 | Haneda et al. | 438/627 |
| 2010/0164119 A1 * | 7/2010 | Takesako et al. | 257/774 |

FOREIGN PATENT DOCUMENTS

| | | | |
|---|---|---|---|
| JP | 2005-277390 A | 10/2005 | |
| JP | 2007-27259 A | 2/2007 | |
| KR | 10-2007-0008366 A | 1/2007 | |

OTHER PUBLICATIONS

T. Usui et al. "Low Resistive and Highly Reliable Cu Dual-Damascene Interconnect Technology Using Self-Formed MnSixOy Barrier Layer," proceeding of IEEE IITC, 2005, p. 188.
Korean Notice of Preliminary Rejection, English-language translation, mailed Jan. 31, 2011 for corresponding Korean Application No. 10-2009-0045018.

* cited by examiner

*Primary Examiner* — A O Williams
(74) *Attorney, Agent, or Firm* — Fujitsu Patent Center

(57) ABSTRACT

A semiconductor device includes an insulating film including oxygen formed over a semiconductor substrate, a recess formed in the insulating film, a refractory metal film formed on the inner wall of the recess, a metal film including copper, manganese, and nitrogen formed on the refractory metal film, and a copper film formed on the metal film to fill in the recess.

6 Claims, 28 Drawing Sheets

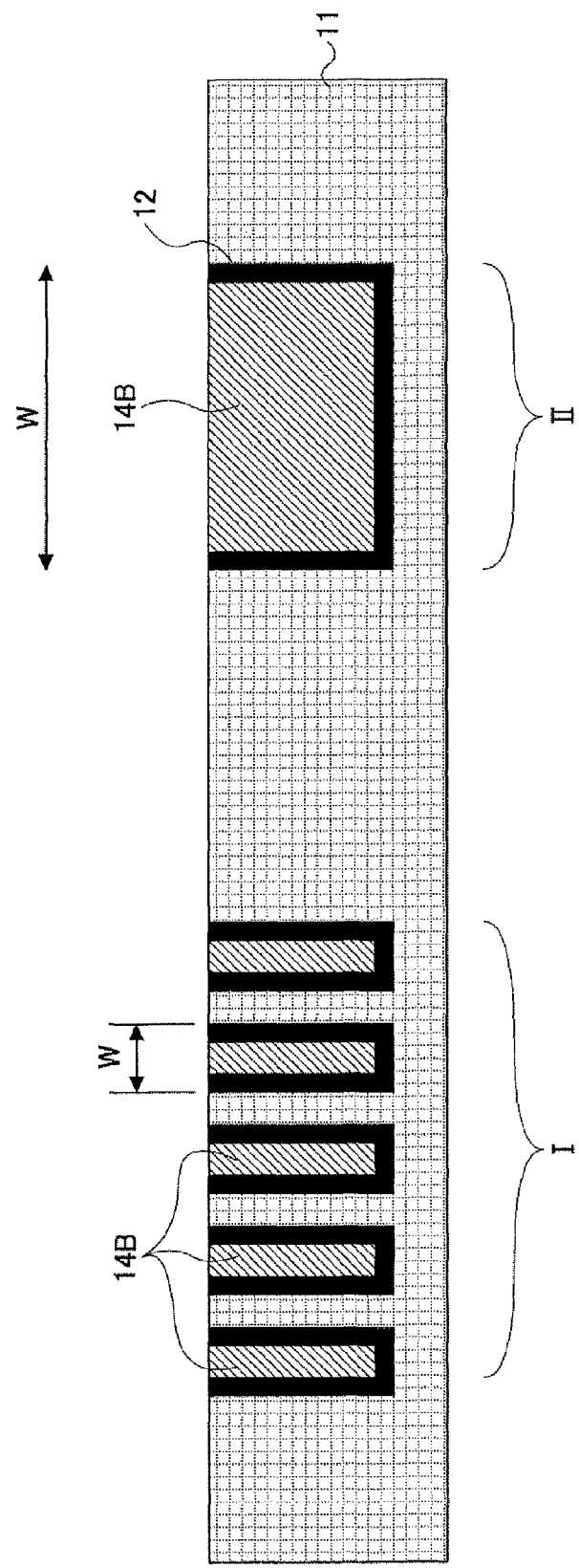

SEMICONDUCTOR DEVICE WITH REDUCED INCREASE IN COPPER FILM RESISTANCE

CROSS-REFERENCE TO RELATED APPLICATION(S)

The present application is based upon and claims the benefit of priority of the prior Japanese Patent Application No. 2008-165449, filed on Jun. 25, 2008, the entire contents of which are incorporated herein by reference.

FIELD

A certain aspect of the embodiments discussed herein is related to a semiconductor device and a method of manufacturing the semiconductor device.

BACKGROUND

In today's semiconductor integrated circuit devices, an enormous number of semiconductor devices are formed on a common substrate, and a multilayer interconnection structure is used to interconnect these semiconductor devices.

In the multilayer interconnection structure, interlayer insulating films having interconnection patterns forming interconnection layers embedded therein are stacked in layers.

In this multilayer interconnection structure, a lower interconnection layer and an upper interconnection layer are connected with a via contact formed in the interlayer insulating film.

In particular, in recent ultra-microfabricated, ultra-high speed semiconductor devices, low dielectric constant films (so-called low-k films) are used as interlayer insulating films in order to reduce the problem of signal delay (RC delay) in the multilayer interconnection structure. At the same time, patterns of copper (Cu), which is low in resistance, are used as interconnection patterns.

In the multilayer interconnection structure thus having Cu interconnection patterns embedded in low dielectric constant interlayer insulating films, a process preforming a trench or via hole in an interlayer insulating film, a so-called damascene or dual-damascene process, is employed because it is difficult to pattern a Cu layer by dry etching. In the damascene or dual-damascene process, the trench or via hole thus formed is filled with a Cu layer, and an excessive portion of the Cu layer on the interlayer insulating film is thereafter removed by chemical-mechanical polishing (CMP).

At this point, if the Cu interconnection pattern comes into direct contact with the interlayer insulating film, Cu atoms are diffused into the interlayer insulating film to cause problems such as a short-circuit. Accordingly, as a common practice, the sidewall and bottom surfaces of the trench or via hole where the Cu interconnection pattern is formed are covered with a conductive diffusion barrier, or a so-called barrier metal film, and the Cu layer is deposited on the barrier metal film. Common examples of the barrier metal film include refractory metals such as tantalum (Ta), titanium (Ti), and tungsten (W) and conductive nitrides of these refractory metals.

On the other hand, in recent ultra-microfabricated, ultra-high speed semiconductor devices of the 45 nm generation or a later generation, the size of a trench or via hole formed in interlayer insulating films is extremely reduced with progress in microfabrication.

As a result, in order to achieve a desired reduction in interconnect resistance using such a barrier metal film having high resistivity, the thickness of the barrier metal film formed on the fine trench or via hole is reduced as much as possible.

On the other hand, the sidewall and bottom surfaces of the trench or via hole are covered with the barrier metal film.

With respect to this a situation, Japanese Laid-Open Patent Publication No. 2005-277390 discloses covering a trench or via hole formed in an interlayer insulating layer directly with a copper-manganese alloy layer (Cu—Mn alloy layer).

Japanese Laid-Open Patent Publication No. 2005-277390 discloses forming a manganese silicon oxide layer having a thickness of 2 nm to 3 nm and a composition of $MnSi_xO_y$ as a diffusion barrier layer at the interface between such a Cu—Mn alloy layer and an interlayer insulating film through the self-formation reaction of Mn in the Cu—Mn alloy layer and Si and oxygen in the interlayer insulating film.

According to this technique, however, there is the problem of insufficient adhesion to a Cu film due to the $MnSi_xO_y$ composition of the self-formed layer and a low concentration of a metal element included in the film.

Therefore, Japanese Laid-Open Patent Publication No. 2007-027259 discloses a structure where a Cu—Mn alloy layer and a barrier metal film of a refractory metal such as Ta or Ti are combined.

With such a combination structure of a Cu—Mn alloy layer and a barrier metal film of a refractory metal such as Ta or Ti, a preferable feature of increased resistance to oxidation is also obtained for the following reason.

In these years, it has been proposed to use a porous low dielectric constant film as a low dielectric constant material forming an interlayer insulating film in order to avoid signal delay (RC delay). However, such a porous low dielectric constant material is low in density so as to be easily damaged by plasma processing at the time of manufacture. The damaged film is more likely to have moisture adsorbed to its surface or inside.

Therefore, a barrier metal film formed on such a porous low dielectric constant film is likely to be oxidized because of the moisture adsorbed inside the porous low dielectric constant film, so that the performance of the barrier metal film as a diffusion barrier and its adhesion to a Cu interconnection layer or via plug are likely to be degraded.

However, using the above-described Cu—Mn alloy layer in such a structure causes Mn in the Cu—Mn alloy layer to react with an oxidized portion of the barrier metal film so as to make it possible to maintain the performance of the barrier metal film as a diffusion barrier and its high adhesion to a Cu interconnection layer or via plug. Therefore, studies have been made of forming Cu interconnection layers or via plugs by a damascene or dual-damascene process using such a Cu—Mn alloy layer.

SUMMARY

According to aspects of an embodiment, a semiconductor device includes an insulating film formed over a semiconductor substrate, the insulating film including oxygen; a recess formed in the insulating film; a refractory metal film formed on an inner wall of the recess; a metal film formed on the refractory metal film, the metal film including copper, manganese, and nitrogen; and a copper film formed on the metal film to fill in the recess.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

BRIEF DESCRIPTION OF THE DRAWINGS

FIG. 4 is a diagram illustrating the result of FIG. 1.

DESCRIPTION OF EMBODIMENTS

Preferred embodiments of the present invention will be explained with reference to accompanying drawings.

First, a description is given of a technique related to the present invention.

Figure 1:
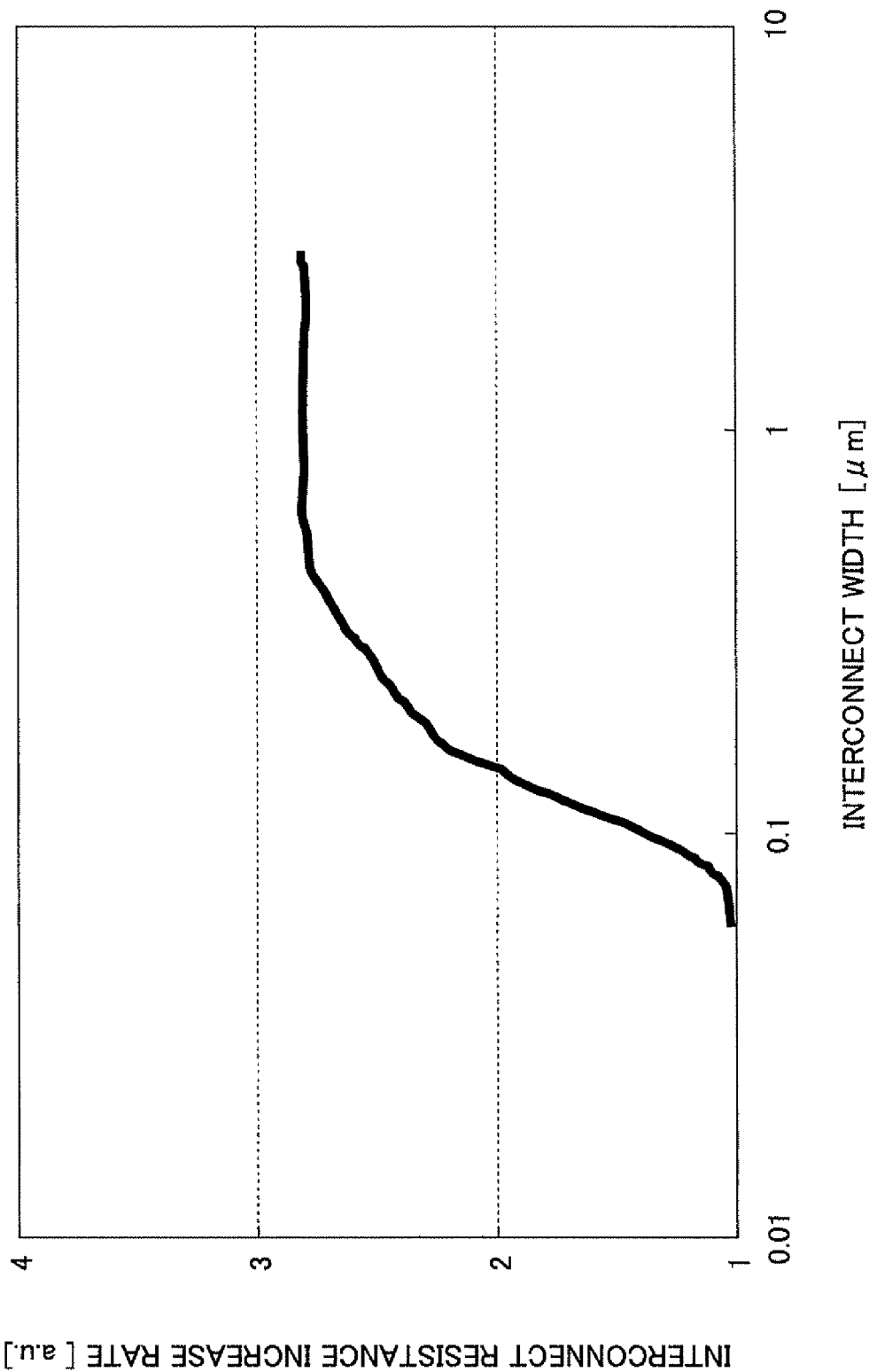
FIG. 1 is a diagram illustrating related art.
Figure 2:
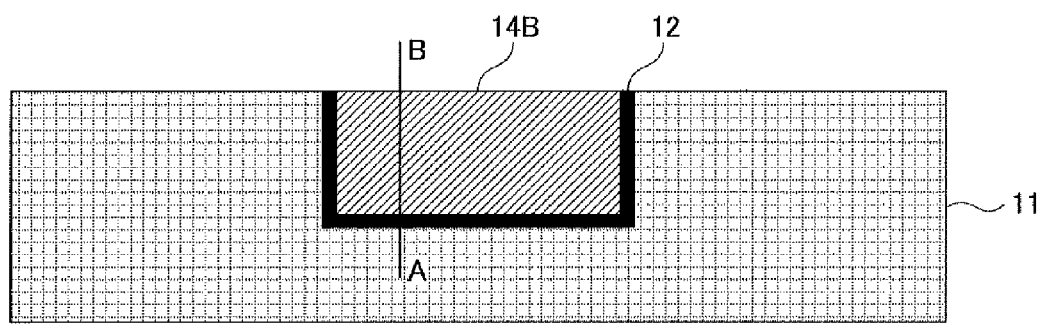
FIG. 2 is a diagram illustrating a Cu interconnection pattern sample according to the related art.

FIG. 1 is a graph illustrating the rate of increase in resistance (resistance increase rate) at the time of application of a Cu—Mn alloy relative to the Pure-Cu condition with respect to a Cu interconnection pattern 14B formed by a damascene process illustrated in FIG. 2. In FIG. 1, the interconnect width is varied. The Cu interconnection pattern 14B at the time of application of a Cu—Mn alloy in FIG. 2 is formed by the process of FIG. 3A through FIG. 3E according to the technique related to the present invention.

Figure 3A:
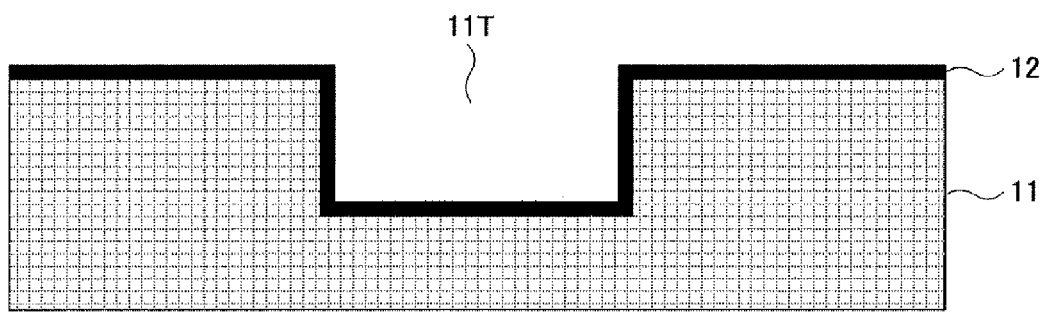
FIG. 3A through FIG. 3E are diagrams illustrating a process for forming the sample of FIG. 2.

Referring to FIG. 3A, a recess 11T such as a trench or via hole is formed in an insulating film 11 of $SiO_2$ or the like. The recess 11T, which is described as a trench in the following description, may be an isolated via hole. Further, the surface of the insulating film 11 including the sidewall and bottom surfaces of the recess 11T is covered with a barrier metal film 12 formed of a refractory metal such as Ta or its conductive nitride. The recess 11T is covered with a portion of the barrier metal film 12 having a cross-sectional shape matching that of the recess 11T.

Figure 3B:
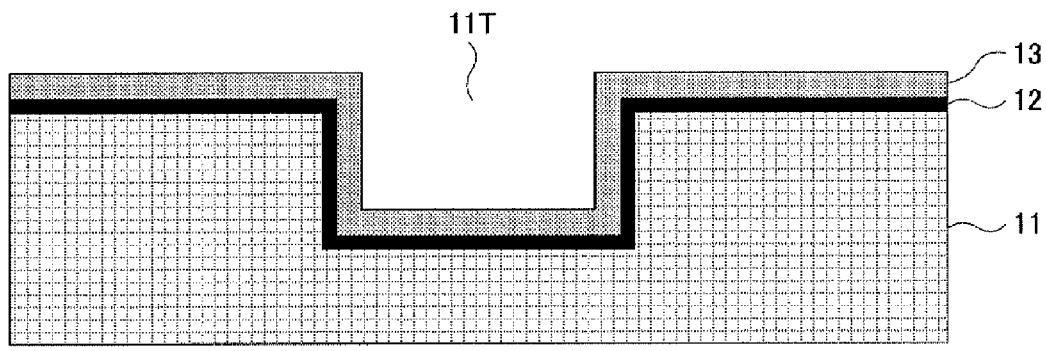

Next, as illustrated in FIG. 3B, a Cu—Mn alloy layer 13 of a Cu—Mn alloy is formed with a cross-sectional shape matching that of the recess 11T on the structure of FIG. 3A so as to cover the barrier metal film 12.

Figure 3C:
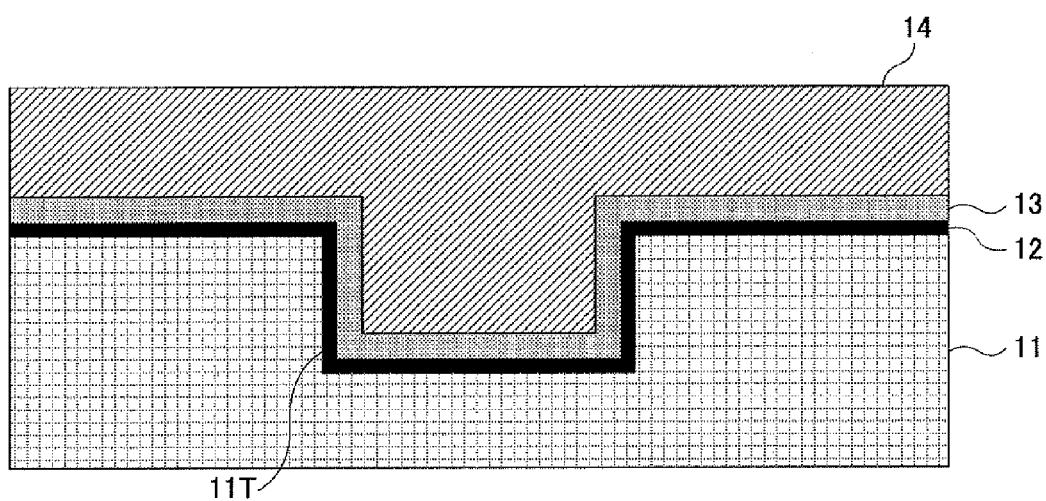

Next, as illustrated in FIG. 3C, a Cu layer 14 is formed on the Cu—Mn alloy layer 13 of the structure of FIG. 3B by electroplating so as to fill in the recess 11T.

Figure 3D:
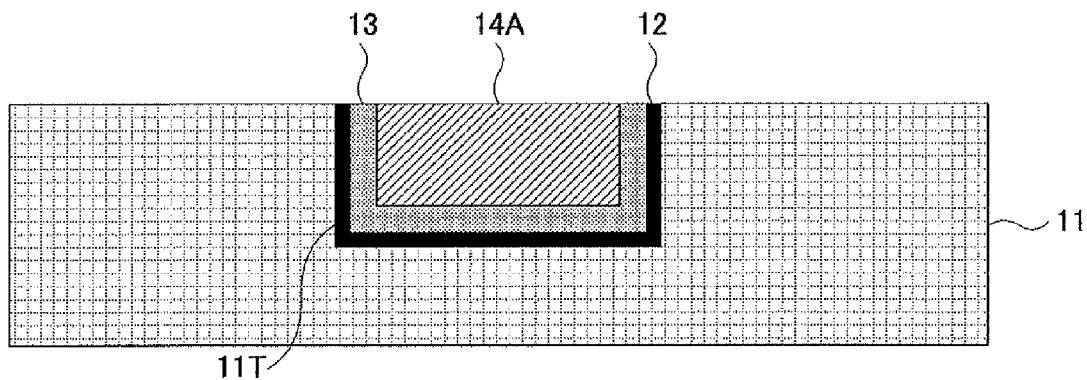

Next, as illustrated in FIG. 3D, the barrier metal film 12, the Cu—Mn alloy layer 13, and the Cu layer 14 on the insulating film 11 are polished by chemical-mechanical polishing (CMP). The CMP of FIG. 3D is continued until the surface of the insulating film 11 is exposed. As a result, as illustrated in FIG. 3D, a Cu pattern 14A is formed that fills in the recess 11T at the surface of the insulating film 11 with the barrier metal film 12 and the Cu—Mn alloy layer 13 being interposed between the Cu pattern 14A and the insulating film ii.

Figure 3E:
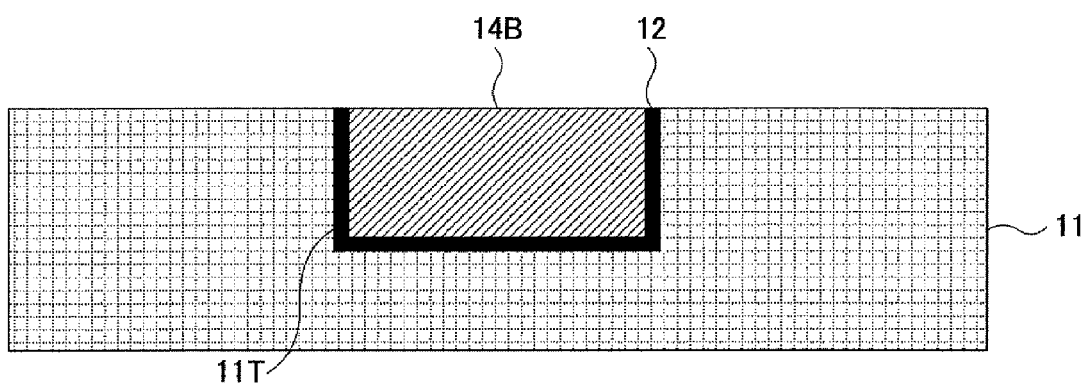

Further, the structure of FIG. 3D is subjected to heat treatment at, for example, 400° C. As a result, as illustrated in FIG. 3E, Mn (manganese) atoms in the Cu—Mn alloy layer 13 react with an oxide at the surface of the barrier metal film 12, so that a Mn oxide is formed whose composition is expressed generally by, for example, $Ta_xMn_yO_z$. Further, at this point, the Cu—Mn alloy layer 13 and the Cu pattern 14A change into a continuous signal Cu interconnection pattern 14B.

Referring again to FIG. 1, the rate of increase in resistance at the transition from the state of FIG. 3D to the state of FIG. 3E decreases as the interconnect width W decreases, and increases as the interconnect width W increases. This is believed to be because when the interconnect width W is small, the ratio of the surface area of the barrier metal film 12 to the volume of the Cu interconnection pattern 14B including the Cu—Mn alloy layer 13 is relatively high as in Region I as illustrated in FIG. 4. That is, the area of the interface between the barrier metal film 12 and the Cu interconnection pattern 14B relative to the volume of the Cu interconnection pattern 14B is greater in Region I than in Region II in FIG. 4. Therefore, substantially all the Mn atoms in the Cu—Mn alloy layer 13 react with the oxide at the surface of the barrier metal film 12 at the time of the heat treatment of FIG. 3E. As a result, the Mn content of the Cu interconnection pattern 14B is reduced with efficiency. On the other hand, in Region II, the ratio of the surface area of the barrier metal film 12 to the volume of the Cu interconnection pattern 14B is low. Therefore, only part of Mn atoms in the Cu—Mn alloy layer 13 reacts with the oxide at the surface of the barrier metal film 12, and unreacted Mn atoms remain in the Cu interconnection pattern 14B. Accordingly, a large increase in interconnect resistivity is believed to be caused by the heat treatment of FIG. 3E as illustrated in FIG. 1.

Figure 5:
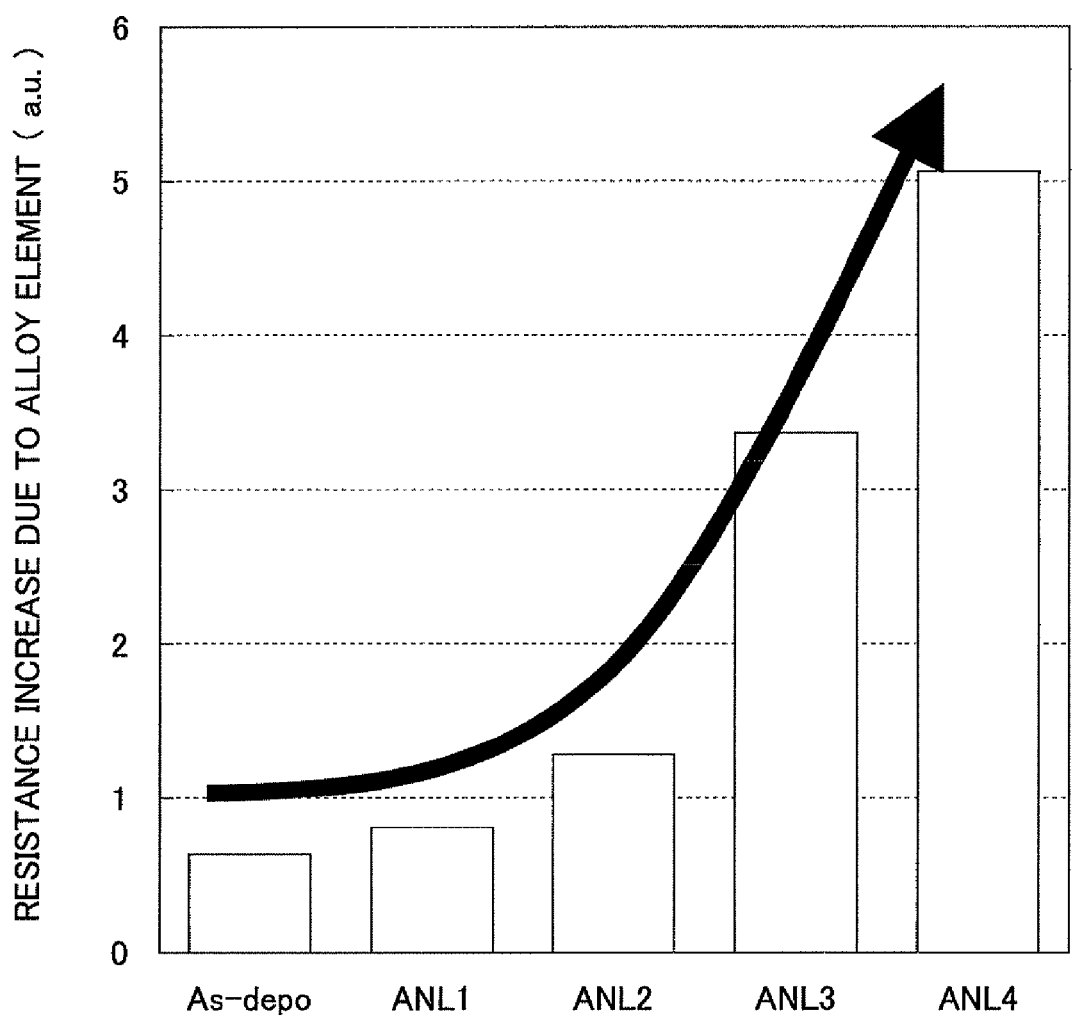
FIG. 5 is a graph illustrating a problem in the related art.

FIG. 5 illustrates simulation results of the rate of increase in resistance relative to pure Cu in the case of varying the heat treatment condition of FIG. 3E from As-depo to ANL1 to ALN2 to ANL3 to ANL4 with respect to the Cu interconnection pattern 14B of FIG. 2. Here, As-depo indicates no heat treatment, and a larger number after "ANL" indicates imposition of a greater heat load. That is, as the number suffixed to "ANL" increases from ANL1 to ANL2 to ANL3 to ANL4, a greater heat load is imposed. For simplicity, it is assumed that no alloy element reacts with other substances to be deposited.

Referring to FIG. 5, the resistance of the Cu interconnection pattern 14B increases as the heat treatment progresses. In actual interconnects, a decrease in resistance is caused by a discharge of an alloy element from a Cu interconnect, the coarsening of crystal grains, and the grain boundary segregation of the alloy element due to the reaction of the alloy element with a barrier metal or an insulating film caused by a heat load, so that FIG. 5 is not followed. FIG. 5 focuses on the diffusion phenomenon of the alloy element.

Figure 6:
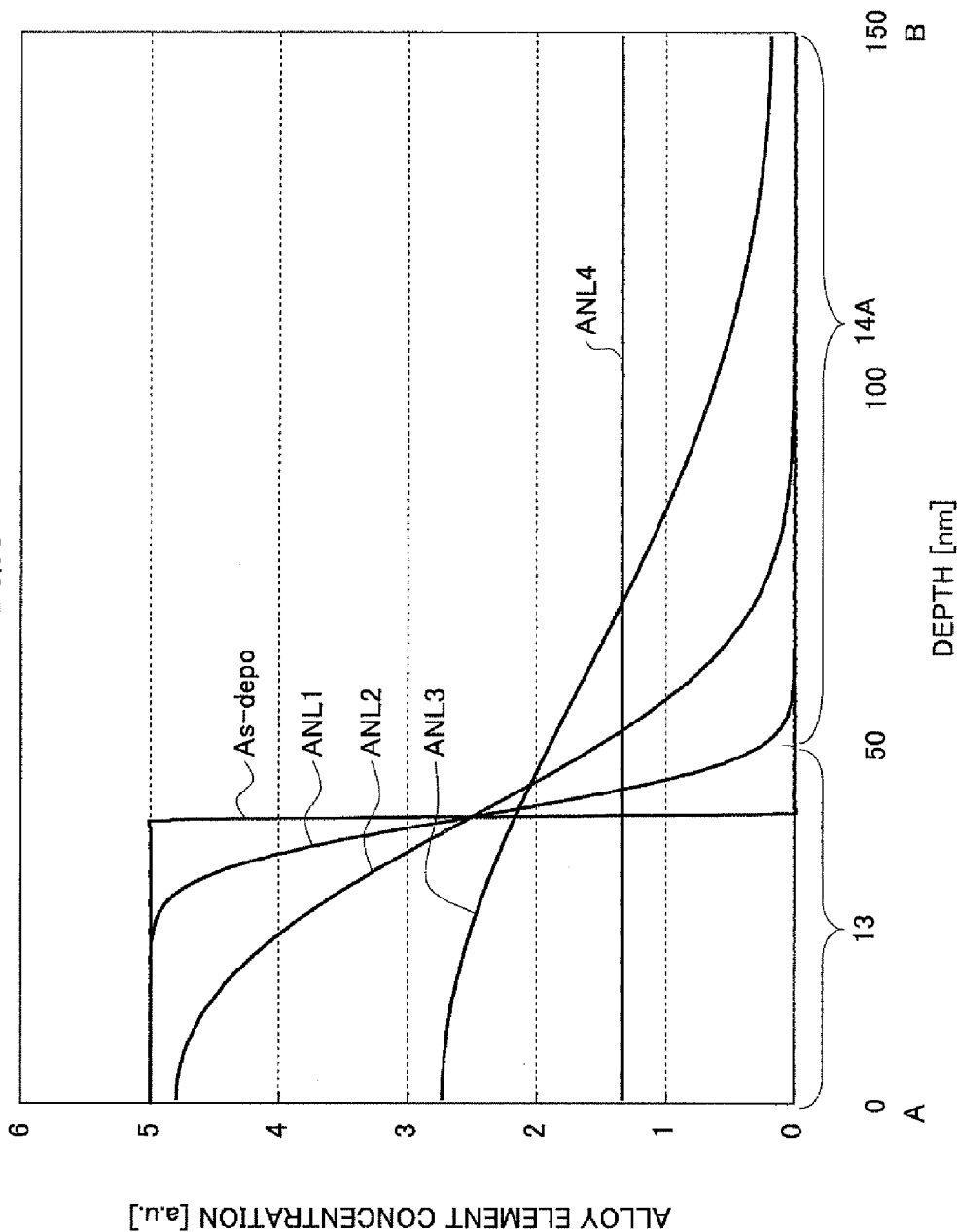
FIG. 6 is another graph illustrating the problem in the related art.

In connection with FIG. 5, FIG. 6 illustrates simulation results of the diffusion of alloy element atoms along the line A-B in the structure of FIG. 2 at the time of the heat treatment of FIG. 3E.

Referring to FIG. 6, the diffusion of alloy element atoms from the Cu alloy layer 13 into the Cu pattern 14A illustrated in FIG. 3D progresses with the progress of the heat treatment. Considering the simulation results of FIG. 6, the increase in the resistance of the Cu interconnection pattern 14B with heat treatment in FIG. 5 is believed to be caused by such diffusion of Mn atoms.

Thus, in a Cu interconnection pattern formed by combining a Cu—Mn alloy layer with a barrier metal film by a damascene process, it is desirable to reduce the diffusion of Mn atoms remaining in the Cu—Mn alloy layer into the Cu interconnection pattern at the time of causing Mn atoms in the Cu—Mn alloy layer to react with an oxidized portion or defects of the barrier metal film for self-repairing of such defects, in order to reduce interconnect resistance.

That is, in a damascene or dual-damascene process using such a Cu—Mn alloy layer, if substantially all Mn atoms in the Cu—Mn alloy layer react with, for example, an oxidized portion of the barrier metal film, the concentration of remaining Mn is low in a Cu interconnection layer or Cu via plug to be formed so as to ensure low resistance. However, if a large amount of Mn remains in the Cu—Mn alloy layer, Mn is diffused from the Cu—Mn alloy layer into the Cu interconnection layer or via plug so as to increase its resistance.

According to one aspect, the diffusion of Mn atoms into the Cu interconnection layer is effectively reduced by using a Cu—Mn—N alloy layer.

[a] First Embodiment

FIG. 7A through FIG. 7E are diagrams illustrating a process of forming a Cu interconnection pattern by a damascene process according to a first embodiment.

Figure 7A:
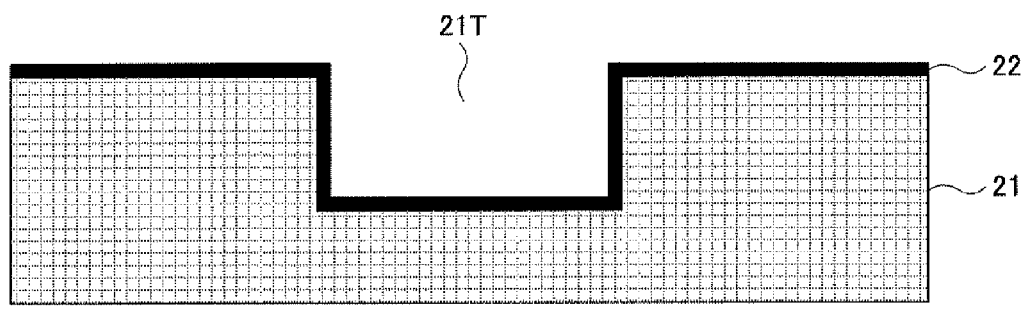
FIG. 7A through FIG. 7E are diagrams illustrating a process for forming a Cu interconnection pattern according to a first embodiment.

Referring to FIG. 7A, a recess 21T such as a trench or via hole is formed in an insulating film 21. Further, the surface of the insulating film 21 including the sidewall and bottom surfaces of the recess 21T is covered with a barrier metal film 22 having a thickness of 1 nm to 10 nm and formed of a refractory metal such as Ta, Ti, or W or its conductive nitride. Preferably, the insulating film 21 includes oxygen so that an oxide can be formed through reaction with Mn. For example, the insulating film 21 may be a silicon oxide film formed by plasma CVD using TEOS as a material. Alternatively, the insulating film 21 may also be a low dielectric constant film based on a silicon oxide film, such as a SiOC film. Alternatively, the insulating film 21 may also be an organic or inorganic low dielectric constant film referred to as a low-k film formed by a coating process or a CVD process. Examples of such an inorganic low dielectric constant film include polyorganosiloxane-based material films and hydrogen-siloxane-based material films in addition to the above-described SiOC film. Examples of such an organic low dielectric constant film include aromatic polyether films such as SiLK (product name) of The Dow Chemical Company and FLARE (product name) of Honeywell International Inc.

The barrier metal film 22 may be defective so that the insulating film 21 is exposed in some portions of the barrier metal film 22. Further, the barrier metal film 22 may have an oxide film in some portions of the barrier metal film 22. The recess 21T is covered with a portion of the barrier metal film 22 having a cross-sectional shape that matches the cross-sectional shape of the recess 21T. Typically, the barrier metal film 22 is formed by sputtering using the above-described refractory metal or its conductive nitride as a target. Alternatively, the barrier metal film 22 may be formed by MOCVD (Metal Organic Chemical Vapor Deposition) or ALD (Atomic Layer Deposition). The barrier metal film 22 may also be a laminated film of a film of the above-described refractory metal and a film of its conductive nitride.

Figure 7B:
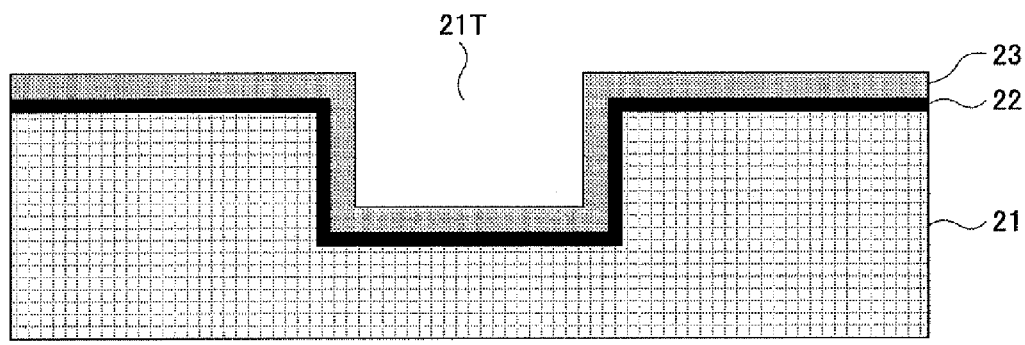

Next, as illustrated in FIG. 7B, a Cu—Mn—N alloy layer 23 of a Cu—Mn alloy including nitrogen (N) is formed, with a cross-sectional shape matching that of the recess 21T, on the structure of FIG. 7A to cover the barrier metal film 22.

More specifically, sputtering is performed with a substrate at $-20°$ C. with a power input of 5 kW in an argon (Ar)-nitrogen gas mixture atmosphere of a total pressure of $10^{-3}$ Pa and a nitrogen content of 20%, using a Cu—Mn alloy with a Mn content of 0.1 at % to 10 at % as a target. As a result, a Cu—Mn—N alloy layer with a Mn content of 0.1 at % to 10 at % and a N content of 2% or less is formed as the Cu—Mn—N alloy layer 23 with a film thickness of, for example, 5 nm to 40 nm, preferably, approximately 10 nm. The Cu—Mn—N layer 23 can be formed by not only sputtering but also MOCVD or ALD.

Further, in the sputtering process, noble gases other than Ar gas, such as helium (He) gas, neon (Ne) gas, xenon (Xe) gas, and krypton (Kr) gas, can also be used.

Figure 7C:
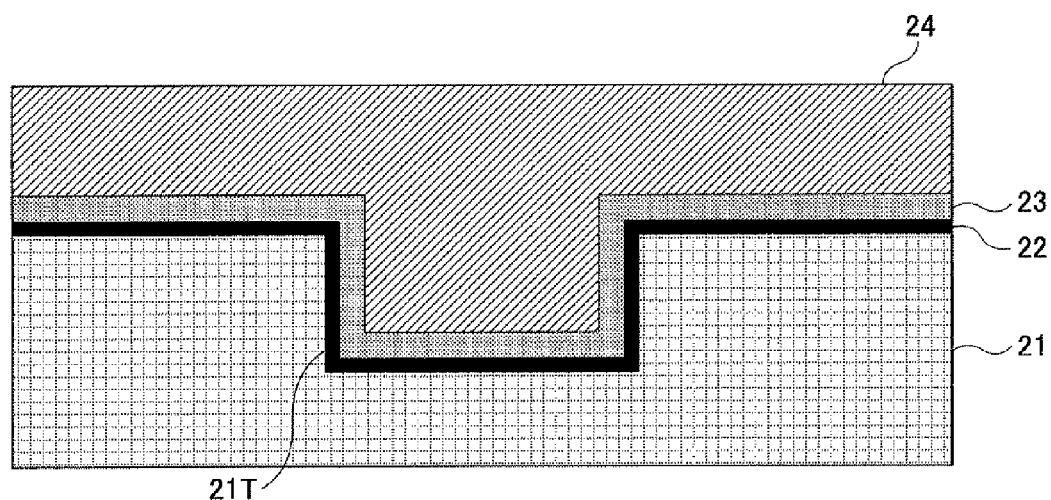

Next, as illustrated in FIG. 7C, a Cu layer 24 is formed on the structure of FIG. 7B by a process such as electroplating so as to fill in the recess 21T.

Figure 7D:
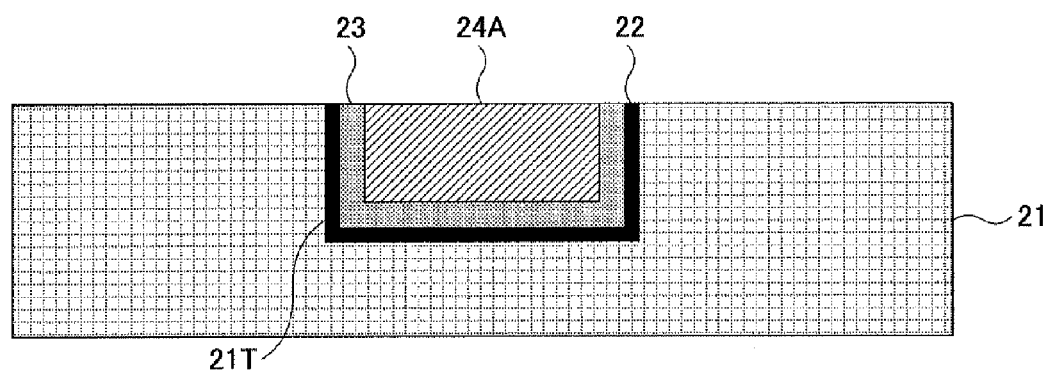

Next, as illustrated in FIG. 7D, the Cu layer 24, the Cu—Mn—N alloy layer 23, and the barrier metal film 22 on the insulating film 21 are successively polished by CMP. The CMP of FIG. 7D is continued until the surface of the insulating film 21 is exposed. As a result, as illustrated in FIG. 7D, a Cu pattern 24A is formed that fills in the recess 21T at the surface of the insulating film 21 with the barrier metal film 22 and the Cu—Mn—N alloy layer 23 being interposed between the Cu pattern 24A and the insulating film 21.

Figure 7E:
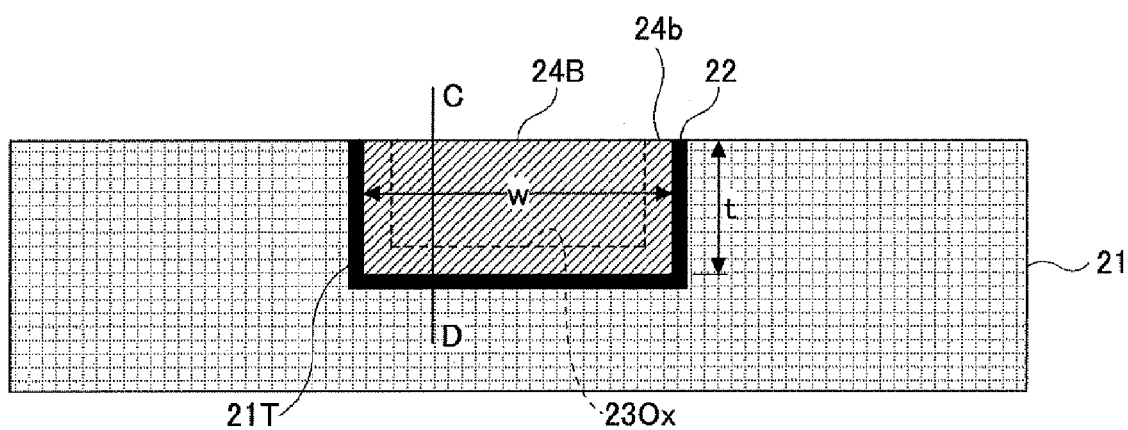

Further, the structure of FIG. 7D is subjected to heat treatment at, for example, $400°$ C. As a result, as illustrated in FIG. 7E, Mn in the Cu—Mn—N alloy layer 23 reacts with an oxide at the surface of the barrier metal film 22 or with the insulating film 21 exposed at defects of the barrier metal film 22, so that a Mn oxide is formed whose composition is expressed generally by, for example, $Ta_xMn_yO_z$ or $MnSi_xO_y$. As a result, defects in the barrier metal film 22 are repaired. Further, at this point, the Cu—Mn—N alloy layer 23 and the Cu pattern 24A change into a continuous Cu interconnection pattern 24B. Further, as described above, Mn atoms react with an oxidized portion of the barrier metal film 22 so that a firm bond is generated between the Cu interconnection pattern 24B and the barrier metal film 22 to increase their adhesion.

Figure 8:
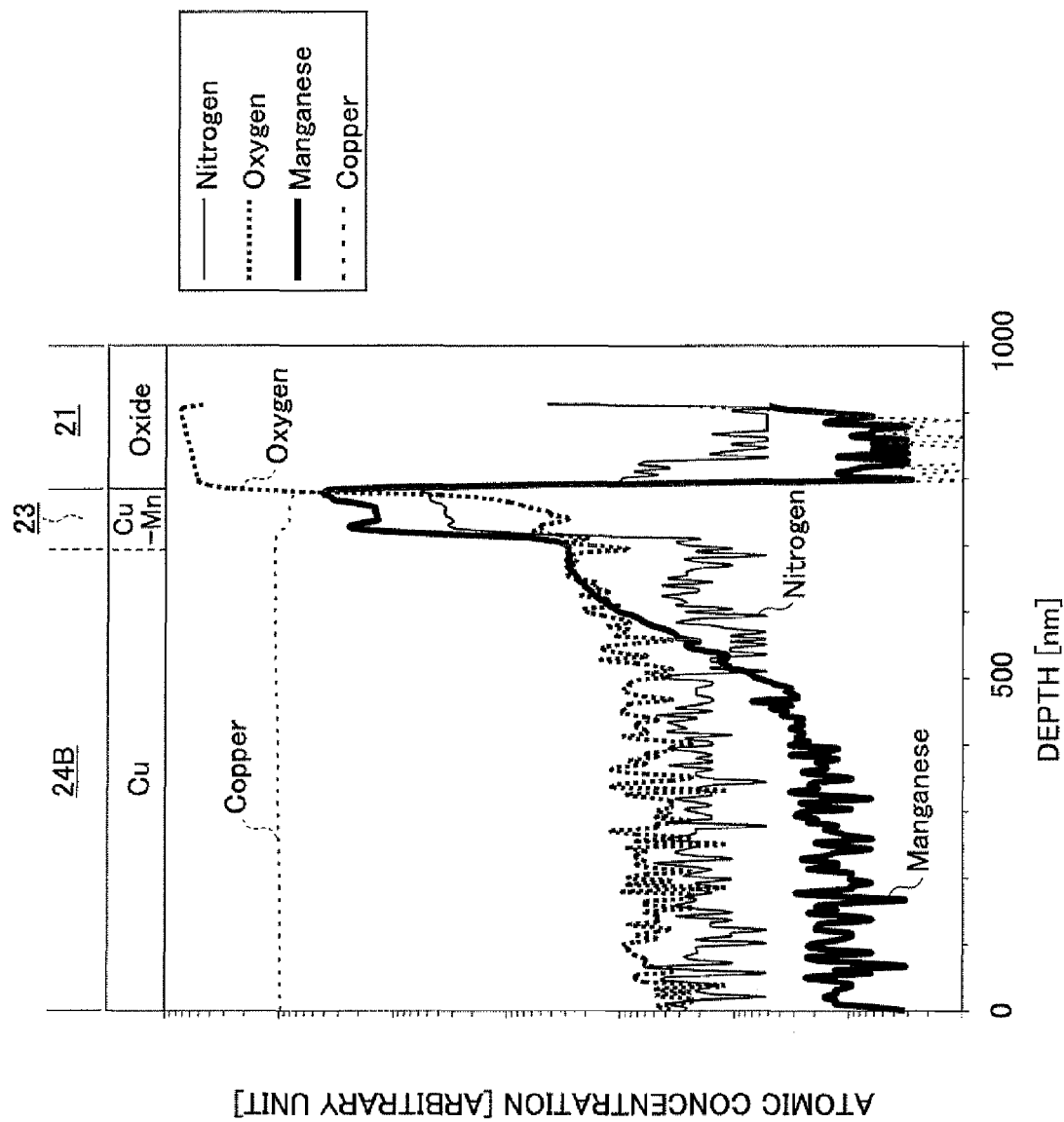
FIG. 8 is a graph illustrating a Mn diffusion reduction effect in the case of using a Cu—Mn—N alloy layer according to the first embodiment.

FIG. 8 illustrates results of a SIMS (Secondary Ion Mass Spectrometer) analysis conducted on the sample of FIG. 7E along the line C-D. In FIG. 8, the left vertical axis (logarithmic axis) represents N, O (oxygen), and Mn concentrations, and the right vertical axis (logarithmic axis) represents the secondary ion intensity of Cu (copper). In the experiment of FIG. 8, the barrier metal film 22 is omitted so that the Cu—Mn—N alloy layer 23 is in direct contact with the insulating film 21 ($SiO_2$ film). In the case of this experiment, the manganese silicon oxide formed at the interface between the Cu—Mn—N alloy layer 23 and the insulating film 21 by the reaction of Mn atoms in the Cu—Mn—N alloy layer 23 with the insulating film 21 serves as a diffusion barrier film for Cu. The below-described results are not limited to the case of a specific width w or depth t (FIG. 7E).

Referring to FIG. 8, in the case of the Cu—Mn—N alloy layer 23 including N, the Mn distribution is mostly limited to the original position of the Cu—Mn—N alloy layer 23 even after the heat treatment process of FIG. 7E.

Figure 9:
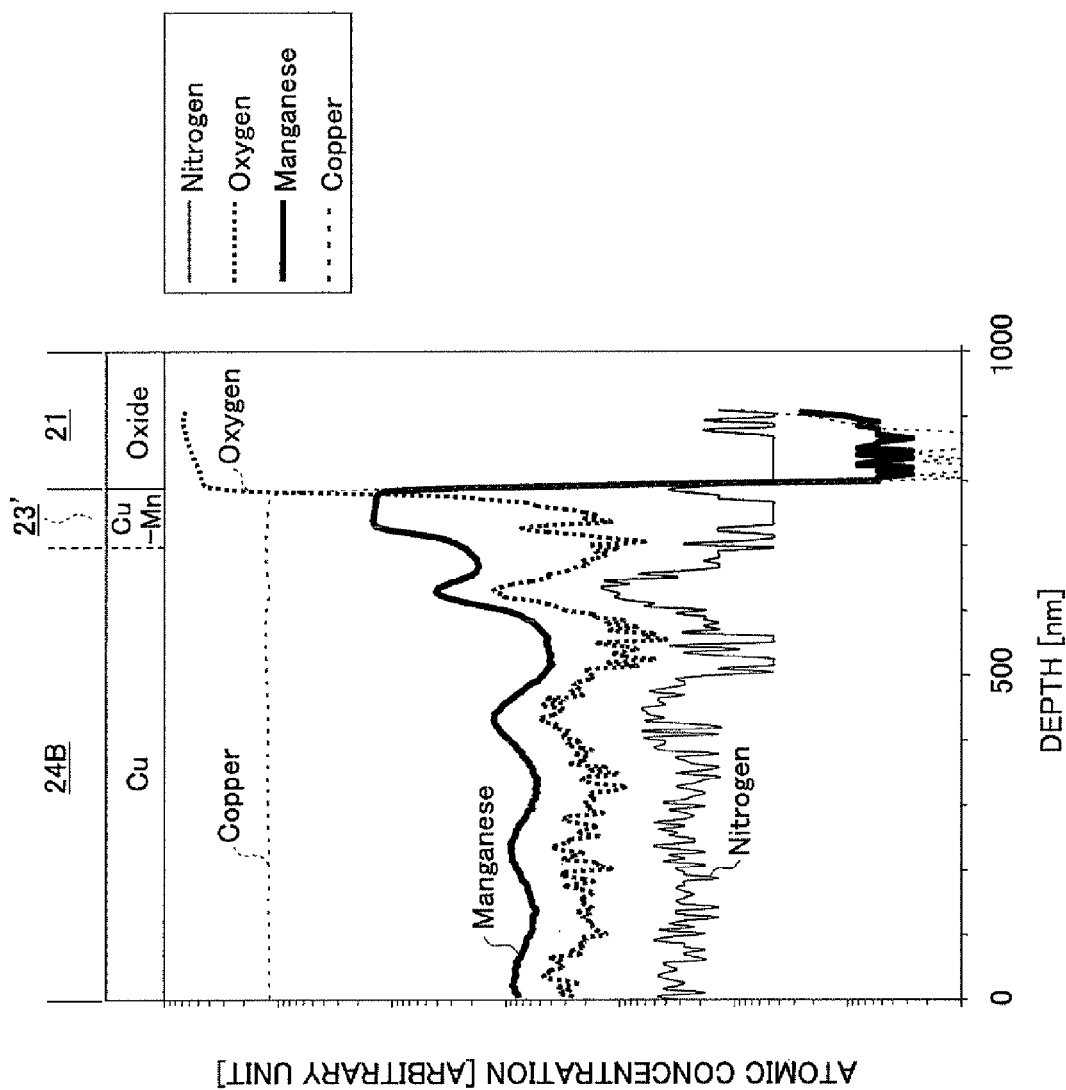
FIG. 9 is a graph illustrating a comparative example of FIG. 8.

On the other hand, FIG. 9 illustrates a SIMS profile in the case of forming a nitrogen-free Cu—Mn alloy 23' layer in place of the Cu—Mn—N alloy layer 23. The nitrogen-free Cu—Mn alloy layer 23' is formed by carrying out sputtering using a Cu—Mn alloy as a target in a nitrogen-free Ar atmosphere.

Referring to FIG. 9, Mn atoms in the Cu—Mn alloy layer 23' are diffused deep into the Cu interconnection pattern 24B after the heat treatment of FIG. 7E. For example, at the surface of the Cu interconnection pattern 24B, the Mn concentration is a hundred to a thousand times that in the case of the Mn—Cu—N alloy layer 23.

It has been found from FIG. 8 and FIG. 9 that it is possible to effectively reduce the diffusion of Mn atoms into the Cu interconnection pattern 24B by using the Cu—Mn—N alloy layer 23 including N in place of the Cu—Mn alloy layer. Considering the relationships illustrated in FIG. 5 and FIG. 6, it is understood that an increase in the resistance of the Cu interconnection pattern 24B due to an increase in Mn concentration can be effectively reduced by reducing the diffusion of Mn atoms in the Cu interconnection pattern 24B.

In FIG. 8, there is oxygen accumulation near the original interface between the Cu—Mn—N alloy layer 23 and the Cu pattern 24A, and in the structure of FIG. 7E, there is a corresponding oxygen accumulation part 23Ox where the interface between the Cu—Mn—N alloy layer 23 and the Cu pattern 24A had been. This indicates the trace of the residual oxygen in the atmosphere bonded to the surface of the Cu—Mn—N alloy layer 23 at the time of its formation. The distribution of Mn atoms is limited mainly to a region 24b near the original position of the Cu—Mn—N alloy layer 23 indicated by the oxygen accumulation part 23Ox. For example, in the region inside the oxygen accumulation part 23Ox in the Cu interconnection pattern 24B, Mn is included mainly in a region within 300 nm from the oxygen accumulation part 23Ox.

Figure 10:
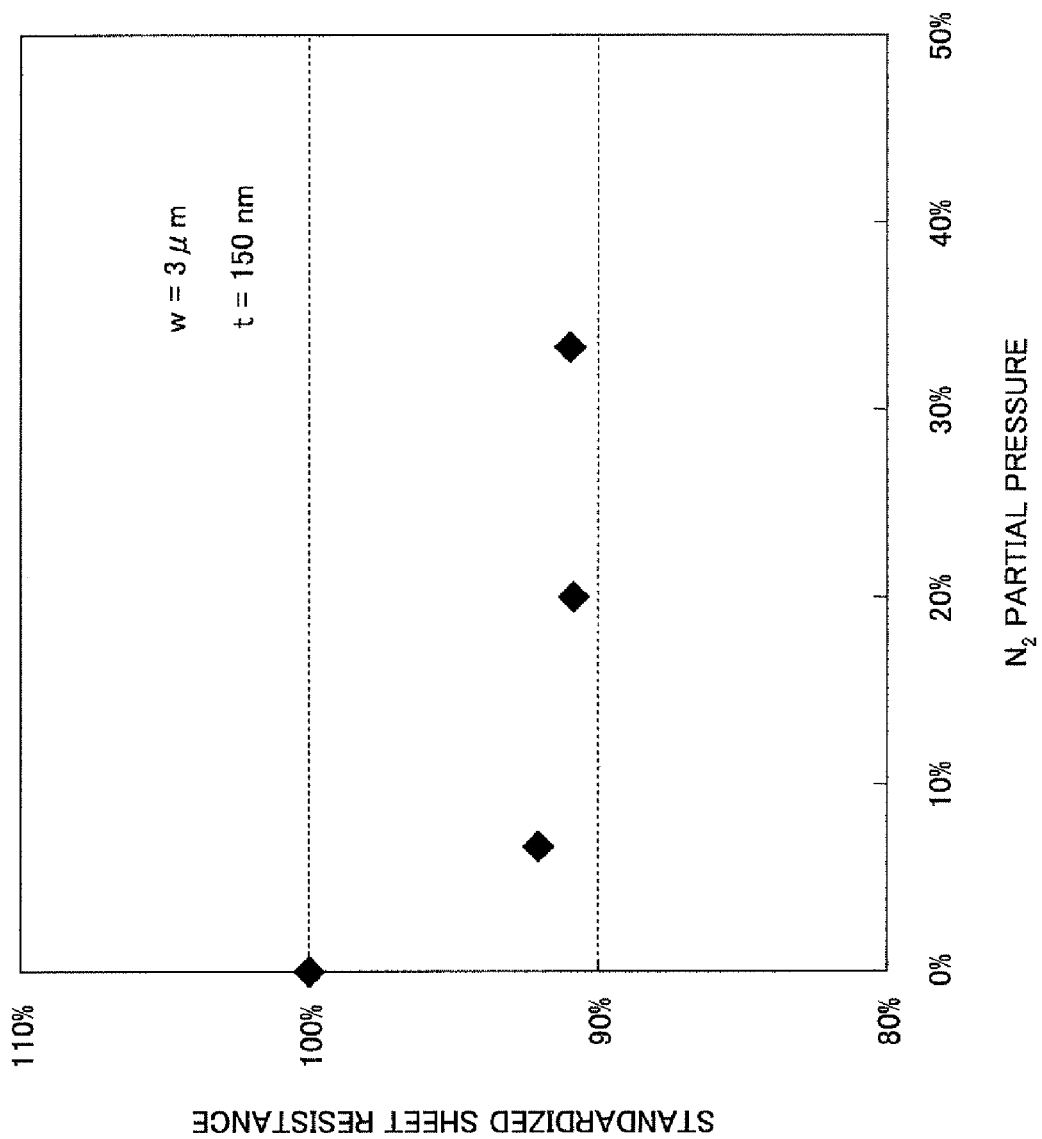
FIG. 10 is a graph illustrating formation conditions of the Cu—Mn—N alloy layer according to the first embodiment.

FIG. 10 illustrates the relationship between the nitrogen concentration (partial pressure) in the Ar-nitrogen mixture atmosphere at the time of formation of the Cu—Mn—N alloy layer 23 in the process of FIG. 7B and the sheet resistance of the Cu interconnection pattern 24B. In FIG. 10, the sheet resistance is standardized relative to the case of using a nitrogen-free Cu—Mn alloy layer for the Cu—Mn—N alloy layer 23 as 100%. The results illustrated in FIG. 10 are of the case where the Cu interconnection pattern 24B has a width w of 3 μm and a depth t of 150 nm.

Referring to FIG. 10, it is understood that the obtained sheet resistance of the Cu interconnection pattern 24B can be reduced by almost 10% by mixing nitrogen gas of a concentration of 7% or more into Ar gas at the time of sputtering.

Figure 11A:
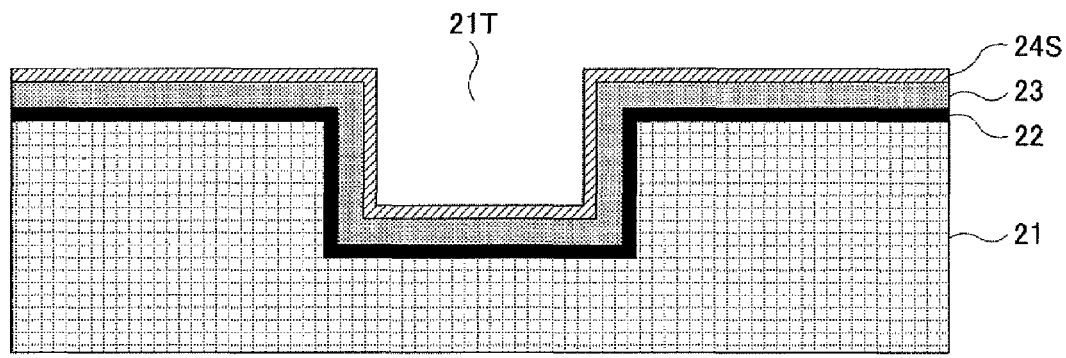
FIG. 11A and FIG. 11B are diagrams illustrating a process for forming a Cu interconnection pattern according to a variation of the first embodiment.
Figure 11B:
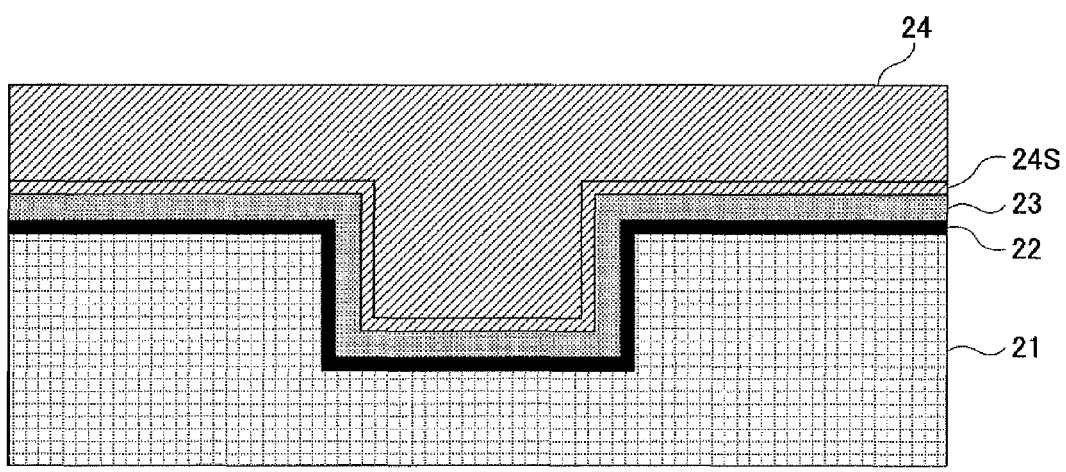

The Cu layer 24 illustrated in FIG. 7C may also be formed by separately forming a Cu seed layer 24S on the Cu—Mn—N alloy layer 23 by sputtering, MOCVD, or ALD and performing electroplating using the Cu seed layer 24S as an electrode as illustrated in FIG. 11A and FIG. 11B. In this case, the electroplating of the Cu layer 24 is performed using the Cu seed layer 24S of low resistance as an electrode. Accordingly, it is possible to increase throughput. In this case, the distinction between the Cu seed layer 24S and the Cu layer 24 is caused to disappear by application of heat treatment to the Cu—Mn—N alloy layer 23 so that the Cu interconnection pattern 24B having the same configuration as illustrated in FIG. 7E is obtained.

According to this embodiment, the Cu pattern 24A or the Cu interconnection pattern 24B is described as forming a Cu interconnection pattern. However, the above description also holds true for the case where the Cu pattern 24A or the Cu interconnection pattern 24B forms a via plug.

[b] Second Embodiment

FIG. 12A through FIG. 12F illustrate a process of forming a Cu interconnection pattern by a damascene process according to a second embodiment. In FIG. 12A through FIG. 12F, elements corresponding to those described above are referred to by the same reference numerals, and a description thereof is omitted.

Figure 12A:
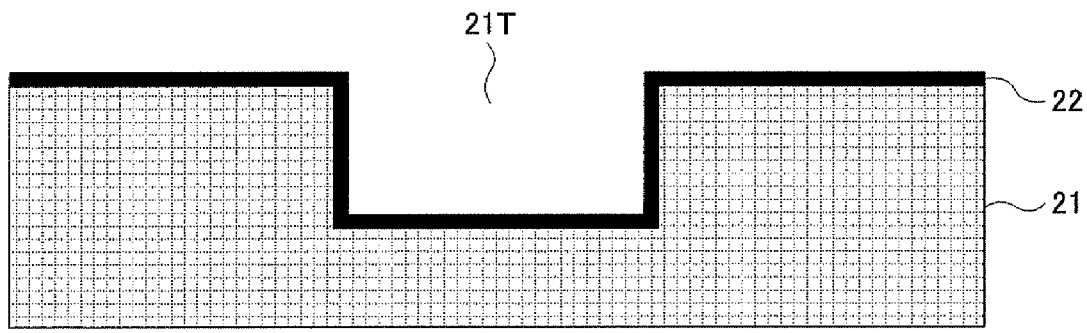
FIG. 12A through FIG. 12F are diagrams illustrating a process for forming a Cu interconnection pattern according to a second embodiment.

Referring to FIG. 12A, which corresponds to FIG. 7A, the sidewall and bottom surfaces of the recess 21T formed in the insulating film 21 are covered with the barrier metal film 22 formed of a refractory metal such as Ta or Ti or its conductive nitride. The same as in the previous embodiment, the barrier metal film 22 may be a laminated film of a film of the refractory metal and a film of its conductive nitride. The barrier metal film 22 may also be defective so as to include an oxide or expose insulating film 21 in some portions of the barrier metal film 22.

Figure 12B:
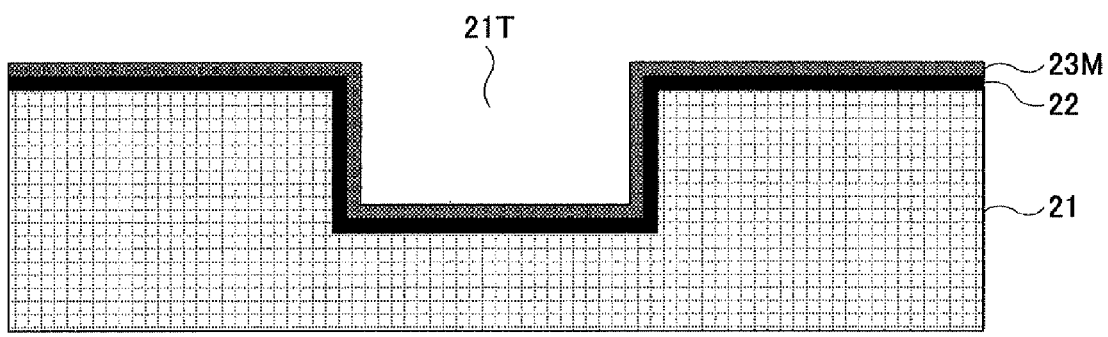

Next, as illustrated in FIG. 12B, by performing sputtering using a Cu—Mn alloy as a target in an Ar atmosphere, a nitrogen-free Cu—Mn alloy layer 23M is formed on the structure of FIG. 12A so as to cover the barrier metal film 22. The nitrogen-free Cu—Mn alloy layer 23M has a cross-sectional shape matching that of the recess 21T, and has a film thickness of, for example, 5 nm, which is half the film thickness of the above-described Cu—Mn—N alloy layer 23.

Figure 12C:
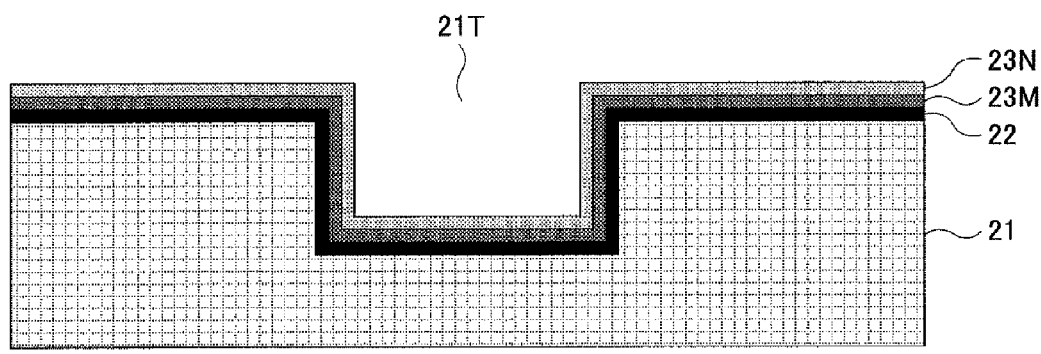

Next, as illustrated in FIG. 12C, a Cu—Mn—N alloy layer 23N including N is formed on the structure of FIG. 12B by performing sputtering in an Ar gas-nitrogen gas mixture atmosphere the same as in FIG. 7B, so as to have a film thickness of, for example, 5 nm with a cross-sectional shape matching that of the Cu—Mn alloy layer 23M.

Figure 12D:
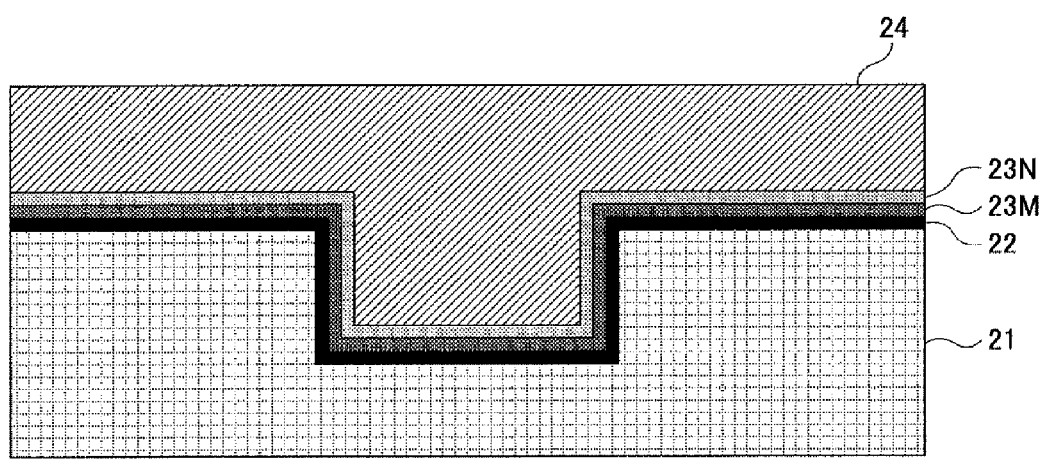

Further, as illustrated in FIG. 12D, the Cu layer 24 is formed on the Cu—Mn—N alloy layer 23N and the Cu—Mn alloy layer 23M so as to fill in the recess 21T by performing electroplating.

Figure 12E:
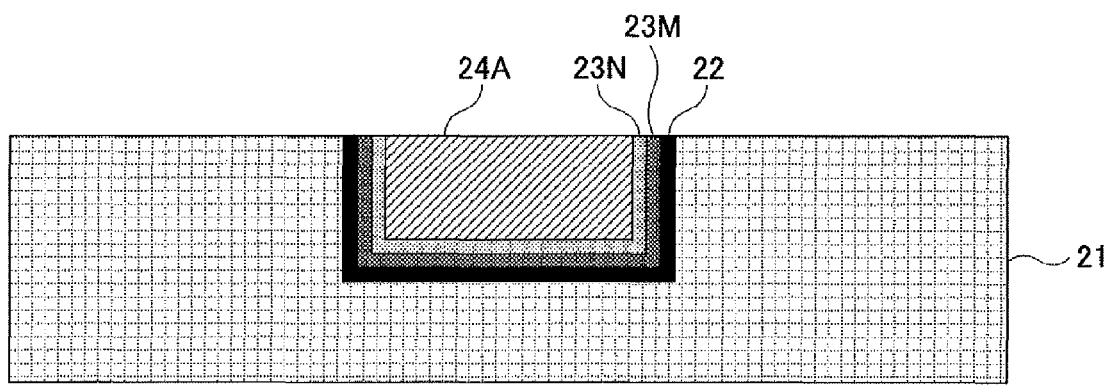

Further, as illustrated in FIG. 12E, the Cu layer 24, the Cu—Mn—N layer 23N, and the Cu—Mn layer 23M on the insulating film 21 are successively polished by CMP. The CMP of FIG. 12E is continued until the surface of the insulating film 21 is exposed. As a result, as illustrated in FIG. 12E, the Cu pattern 24A is formed that fills in the recess 21T at the surface of the insulating film 21 with the barrier metal film 22, the Cu—Mn alloy layer 23M, and the Cu—Mn—N alloy layer 23N being interposed between the Cu pattern 24A and the insulating film 21.

Figure 12F:
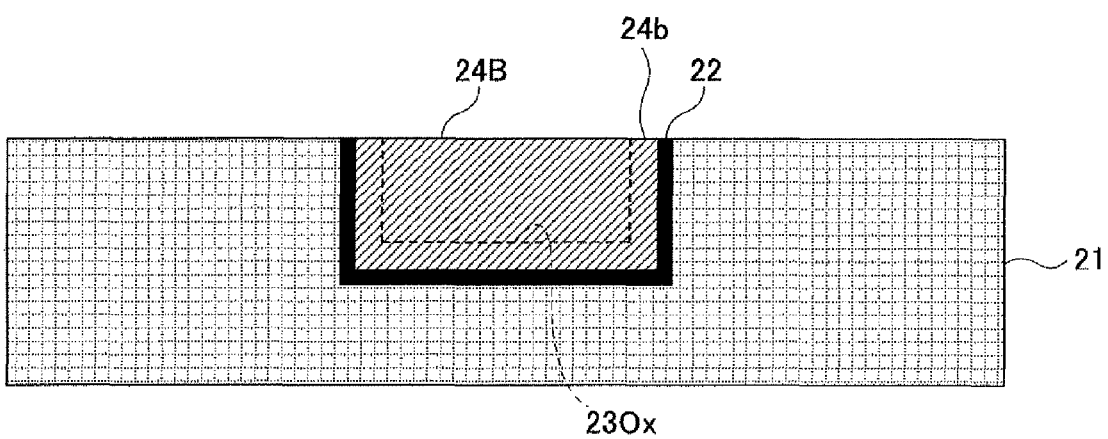

Further, the structure of FIG. 12E is subjected to heat treatment at, for example, 400° C. As a result, as illustrated in FIG. 12F, Mn in the Cu—Mn alloy layer 23M and the Cu—Mn—N alloy layer 23N reacts with an oxide at the surface of the barrier metal film 22 or with the insulating film 21 exposed at defects of the barrier metal film 21. As a result, a Mn oxide is formed whose composition is expressed generally by, for example, $Ta_xMn_yO_z$ or $MnSi_xO_y$. That is, the defects are self-repaired. Further, at this point, the Cu—Mn alloy layer 23M, the Cu—Mn—N alloy layer 23N, and the Cu pattern 24A change into the continuous Cu interconnection pattern 24B. At this point, since the Cu—Mn—N alloy layer 23N is interposed between the Cu—Mn alloy layer 23M and the Cu pattern 24A, the diffusion of Mn into the Cu pattern 24A is reduced by the Cu—Mn—N alloy layer 23N the same as in the case of FIG. 7E. Therefore, the distribution of Mn atoms is limited mainly to the region 24b near the original position of the Cu—Mn—N alloy layer 23N and the Cu—Mn alloy layer 23M indicated by the oxygen accumulation part 23Ox. In the Cu interconnection pattern 24B, the Mn concentration decreases sharply as it moves away from the region 24b.

Also in this embodiment, it is possible to form the Cu seed layer 24S with no Mn or N separately as a seed layer as illustrated in FIG. 11A and FIG. 11B.

According to this embodiment, the Cu pattern 24A or the Cu interconnection pattern 24B is described as forming a Cu interconnection pattern. However, the above description also holds true for the case where the Cu pattern 24A or the Cu interconnection pattern 24B forms a via plug.

[c] Third Embodiment

Next, a description is given of the case of applying the first or second embodiment to the manufacture of a semiconductor device having a multilayer interconnection structure as a third embodiment.

FIG. 13A through FIG. 13K illustrate a process of forming a multilayer interconnection structure according to the third embodiment executed after the process of FIG. 7D or FIG. 12E. In FIG. 13A through FIG. 13K, elements corresponding to those described above are referred to by the same reference numerals, and a description thereof is omitted.

Figure 13A:
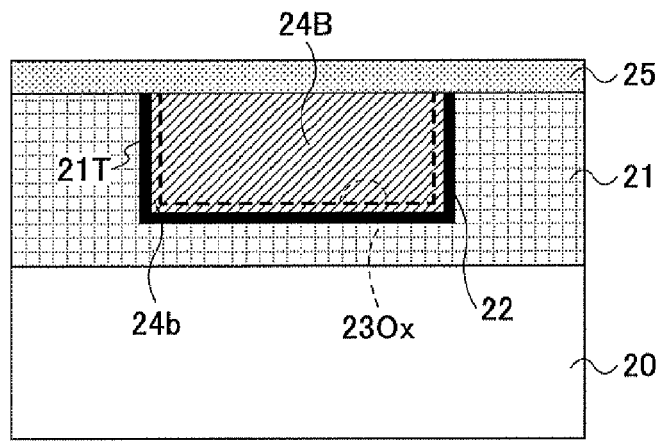
FIG. 13A through FIG. 13K are diagrams illustrating a process for manufacturing a semiconductor device according to a third embodiment.

Referring to FIG. 13A, according to this embodiment, an etching stopper film 25 of SiC is formed on the structure of FIG. 7D or FIG. 12E so as to cover the Cu pattern 24A. The etching stopper film 25 has a thickness of 10 nm to 100 nm. Typically, this etching stopper film 25 is formed at a temperature of 400° C. Further, heat treatment at this point causes Mn atoms in the Cu—Mn—N alloy layer 23 or in the Cu—Mn alloy layer 23M and the Cu—Mn—N alloy layer 23N to move into the barrier metal film 22. As a result, the original Cu—Mn—N alloy layer 23 or the original Cu—Mn alloy layer 23M and Cu—Mn—N alloy layer 23N disappear in the Cu interconnection pattern 24B. However, a Mn oxide thin layer is formed at a position corresponding to the surface of the original Cu—Mn—N alloy layer 23 or 23N at a distance corresponding to the film thickness of the original Cu—Mn—N alloy layer 23 or the total film thickness of the original Cu—Mn alloy layer 23M and Cu—Mn—N alloy layer 23N from the surface of the barrier metal film 22 as indicated by the broken line (23Ox) in FIG. 13A. In this embodiment, the insulating film 21 is formed on a substrate 20.

Figure 13B:
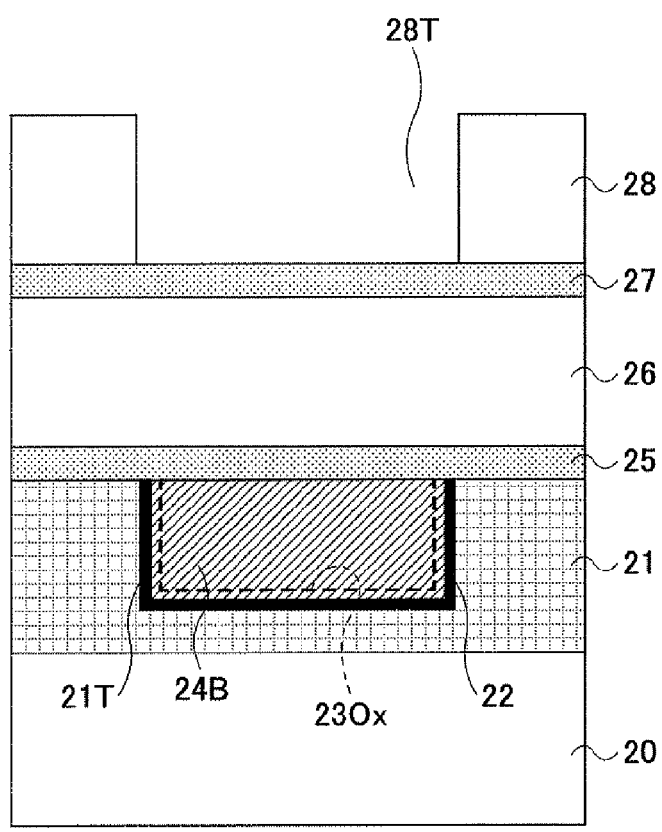

Next, as illustrated in FIG. 13B, an interlayer insulating film 26 having a thickness of 100 nm to 300 nm, an etching stopper film 27 of a SiC or SiN film having a thickness of 10 nm to 100 nm, and an interlayer insulating film 28 having a thickness of 100 nm to 300 nm are successively formed on the structure of FIG. 13A by, for example, plasma CVD. Further, a trench 28T of a desired width is formed in the interlayer insulating film 28 by a dry etching process so as to expose the etching stopper film 27.

A silicon oxide film formed by plasma CVD using TEOS as a material or an organic or inorganic insulating film with a relative dielectric constant of 3 or less formed by plasma CVD or coating may be used as the interlayer insulating films 26 and 28.

Figure 13C:
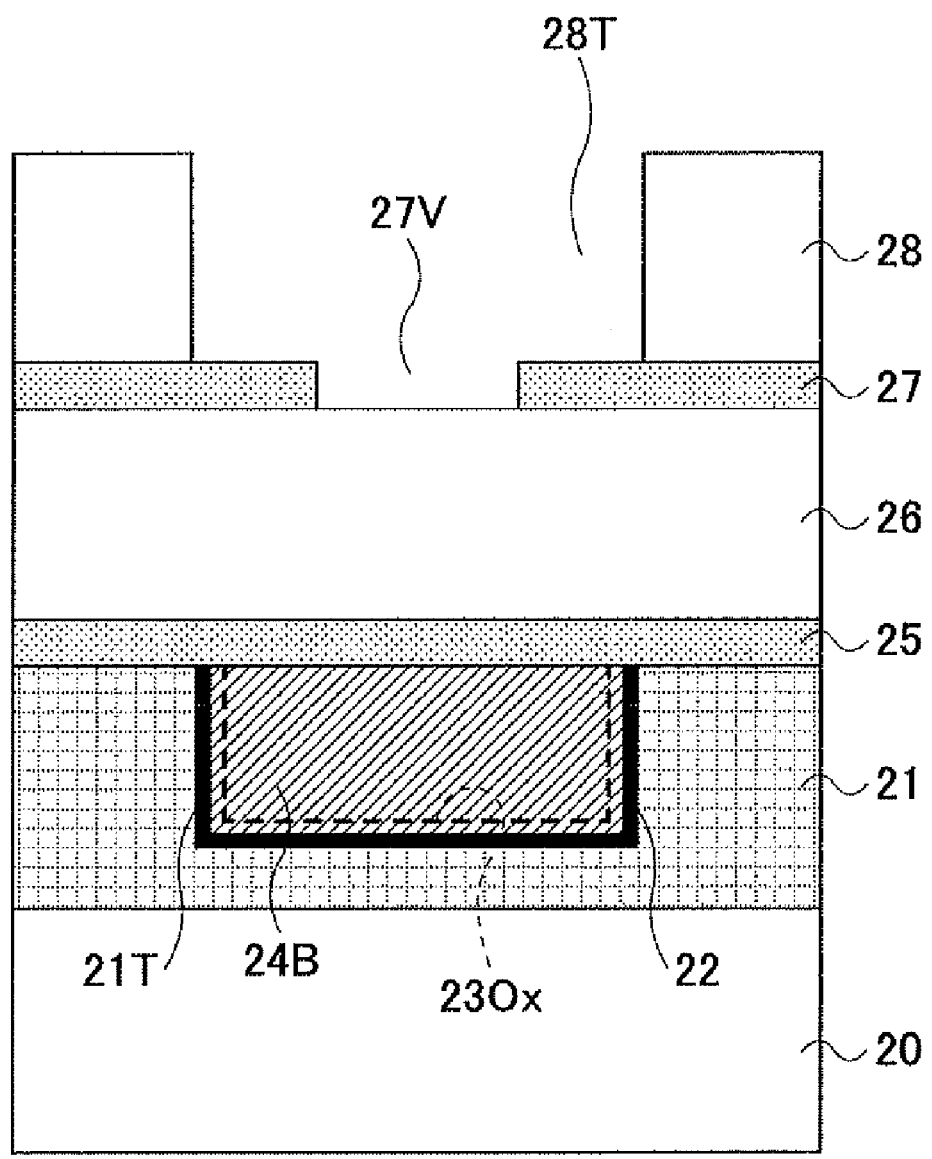
Figure 13D:
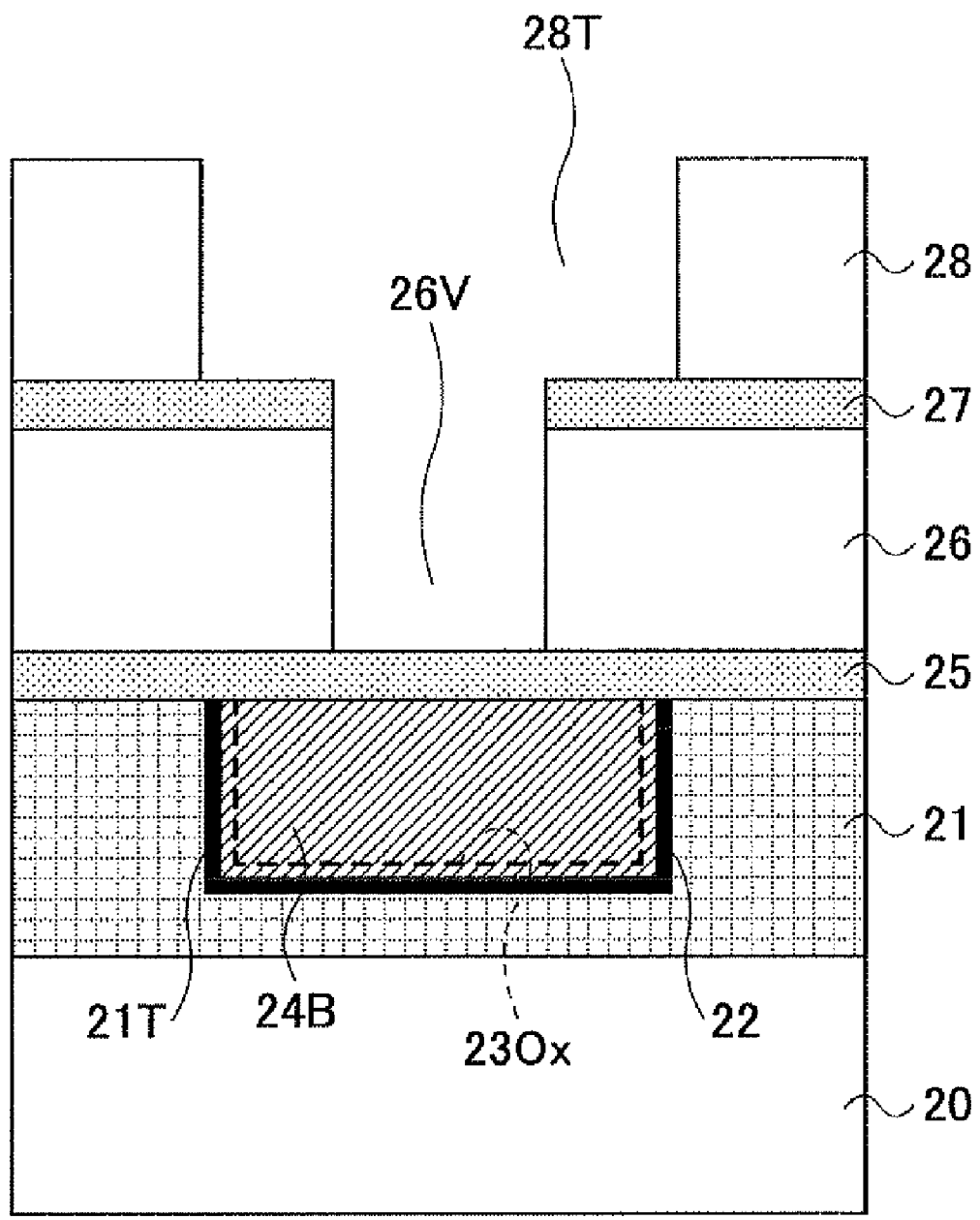

Next, as illustrated in FIG. 13C, an opening 27V corresponding to a predetermined via hole is formed in the etching stopper film 27 exposed in the trench 28T. Further, as illustrated in FIG. 13D, using the etching stopper film 27 as a hard mask, a via hole 26V is formed in the interlayer insulating film 26 so as to expose the etching stopper film 25.

Figure 13E:
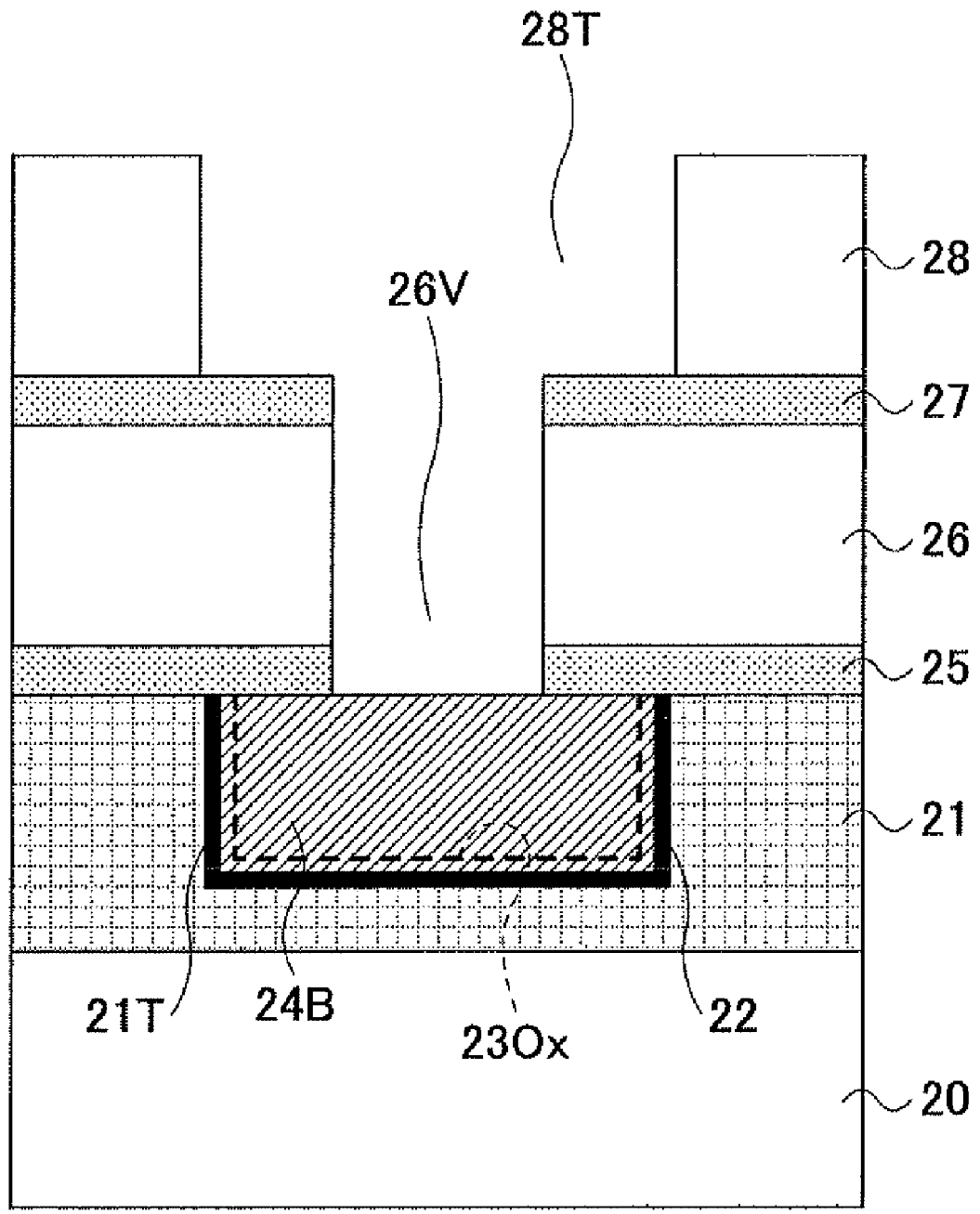
Figure 13F:
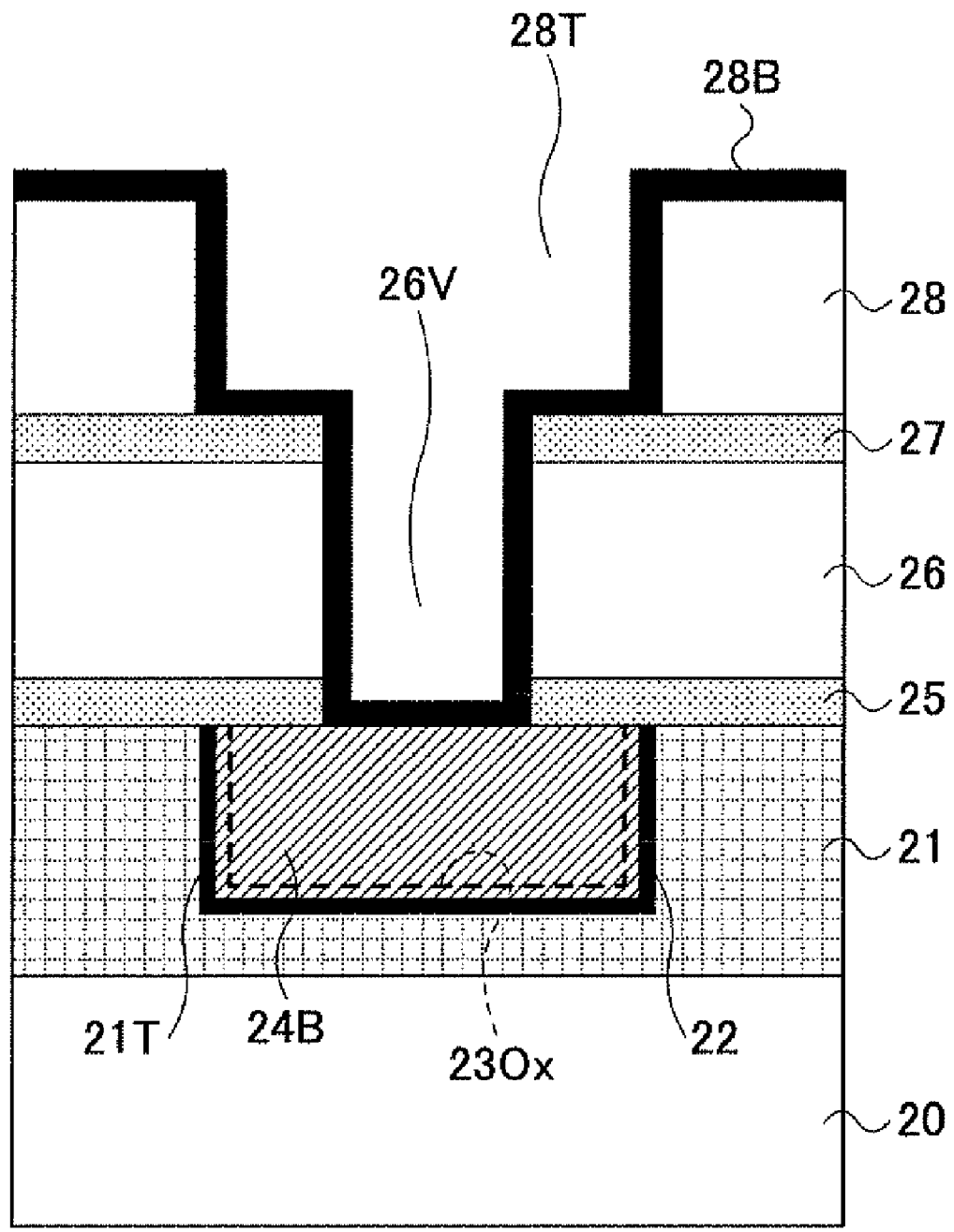

Further, as illustrated in FIG. 13E, the etching stopper film 25 is removed at the bottom of the via hole 26V so as to expose the Cu interconnection pattern 24B. Thereafter, as illustrated in FIG. 13F, a barrier metal film 28B of Ta or Ti is formed with a shape matching those of the trench 28T and the via hole 26V by sputtering or ALD so as to continuously cover the interlayer insulating film 28, the sidewall and bottom surfaces of the trench 28T, and the sidewall and bottom surfaces of the via hole 26V. The barrier metal film 28B has a thickness of approximately 1 nm to approximately 15 nm. The barrier metal film 28B is not limited to a metal film. The barrier metal film 28B may be a metal film including one or more metal elements selected from Ta, Ti, Zr, and Ru, such as a TaN or TiN film, a conductive metal nitride film, or a laminated film of these films. Like the above-described barrier metal film 22, the barrier metal film 28B may include an oxide or defects.

Figure 13G:
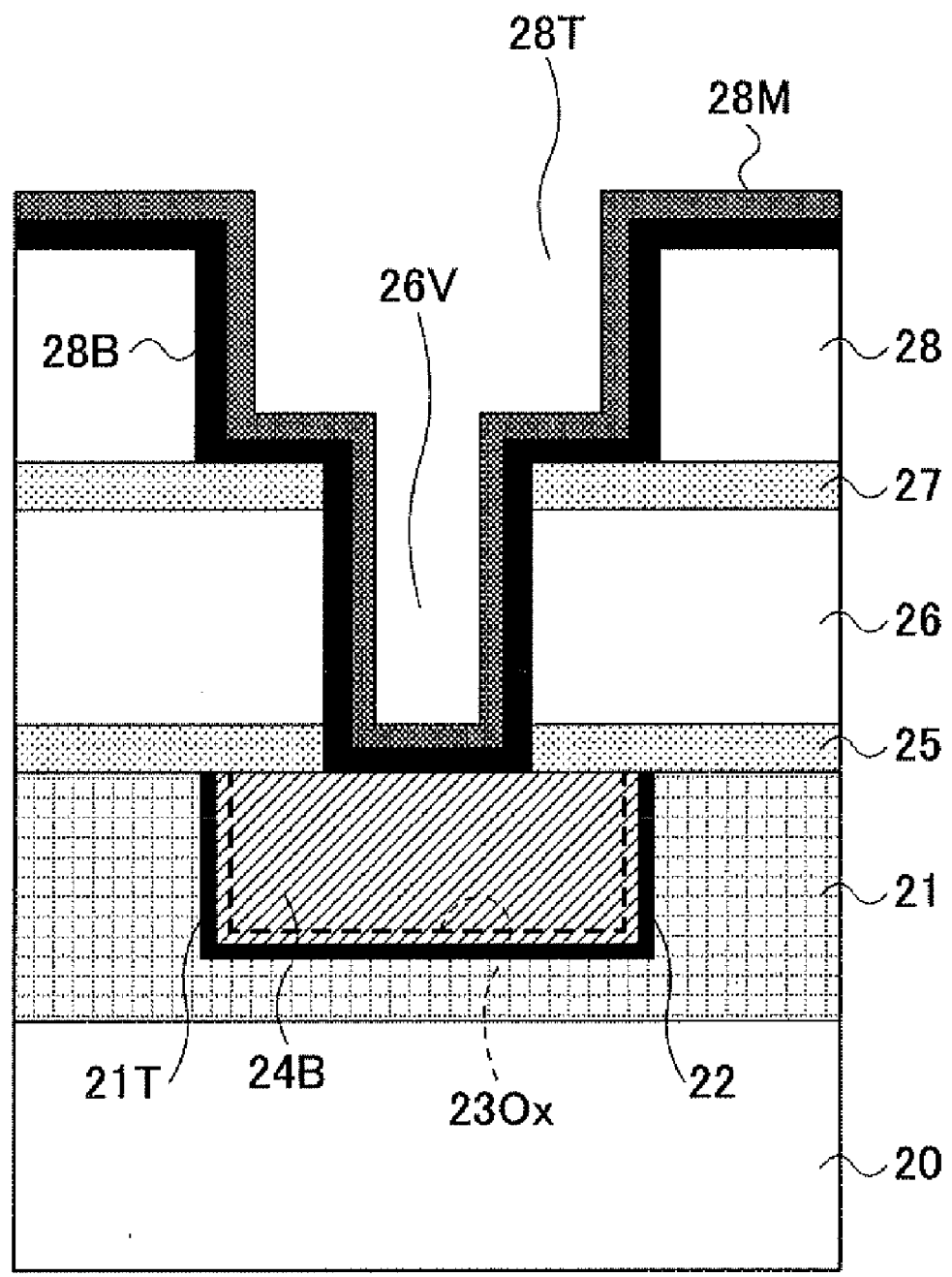

Next, as illustrated in FIG. 13G, a Cu—Mn—N alloy layer 28M is formed on the structure of FIG. 13F by performing sputtering in a nitrogen-containing atmosphere, such as an Ar-nitrogen mixture gas, so as to cover the barrier metal film 28B with a shape matching those of the trench 28T and the via hole 26V. The Cu—Mn—N alloy layer 28M has a film thickness of approximately 1 nm to approximately 15 nm.

Figure 13H:
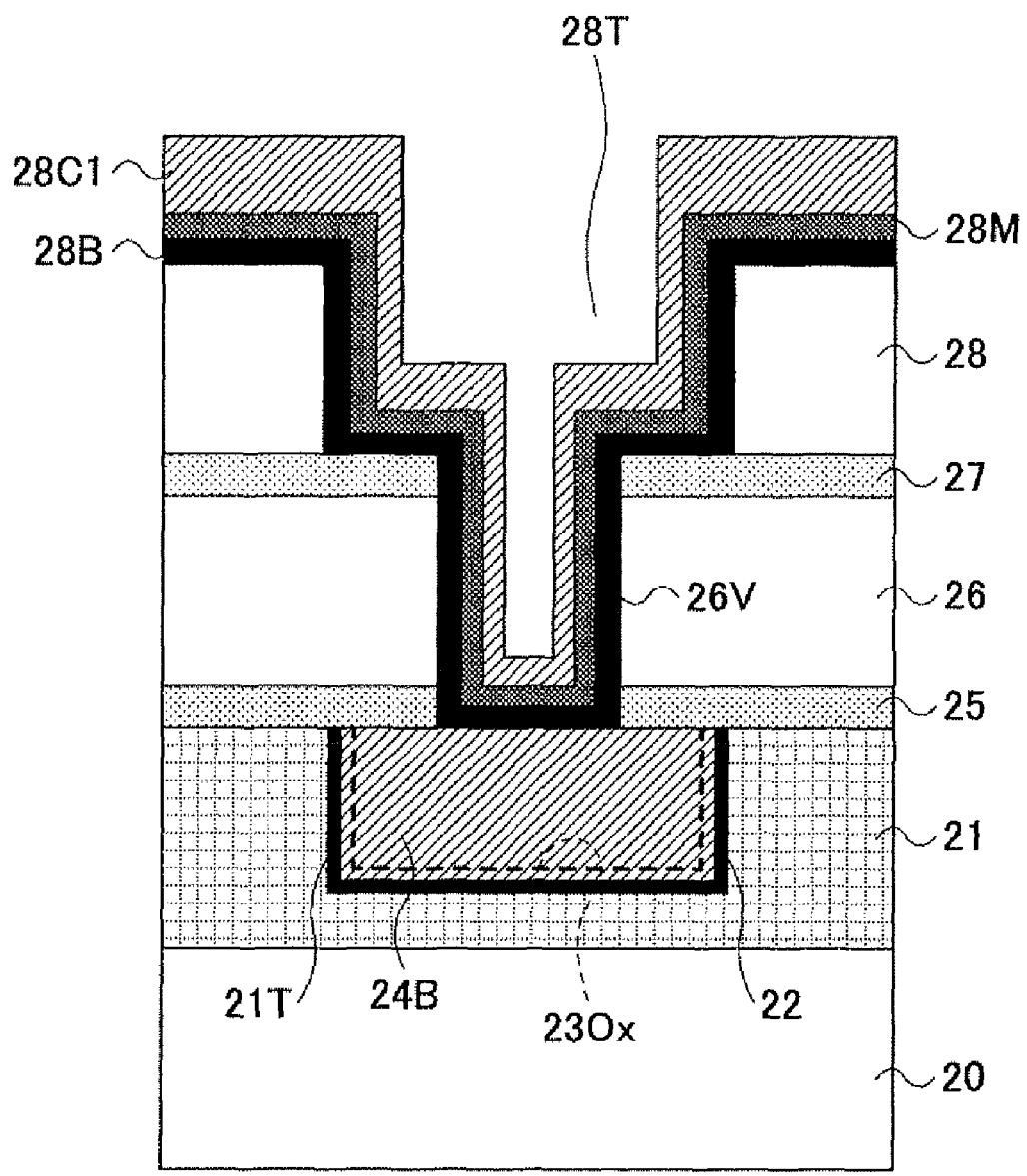
Figure 13I:
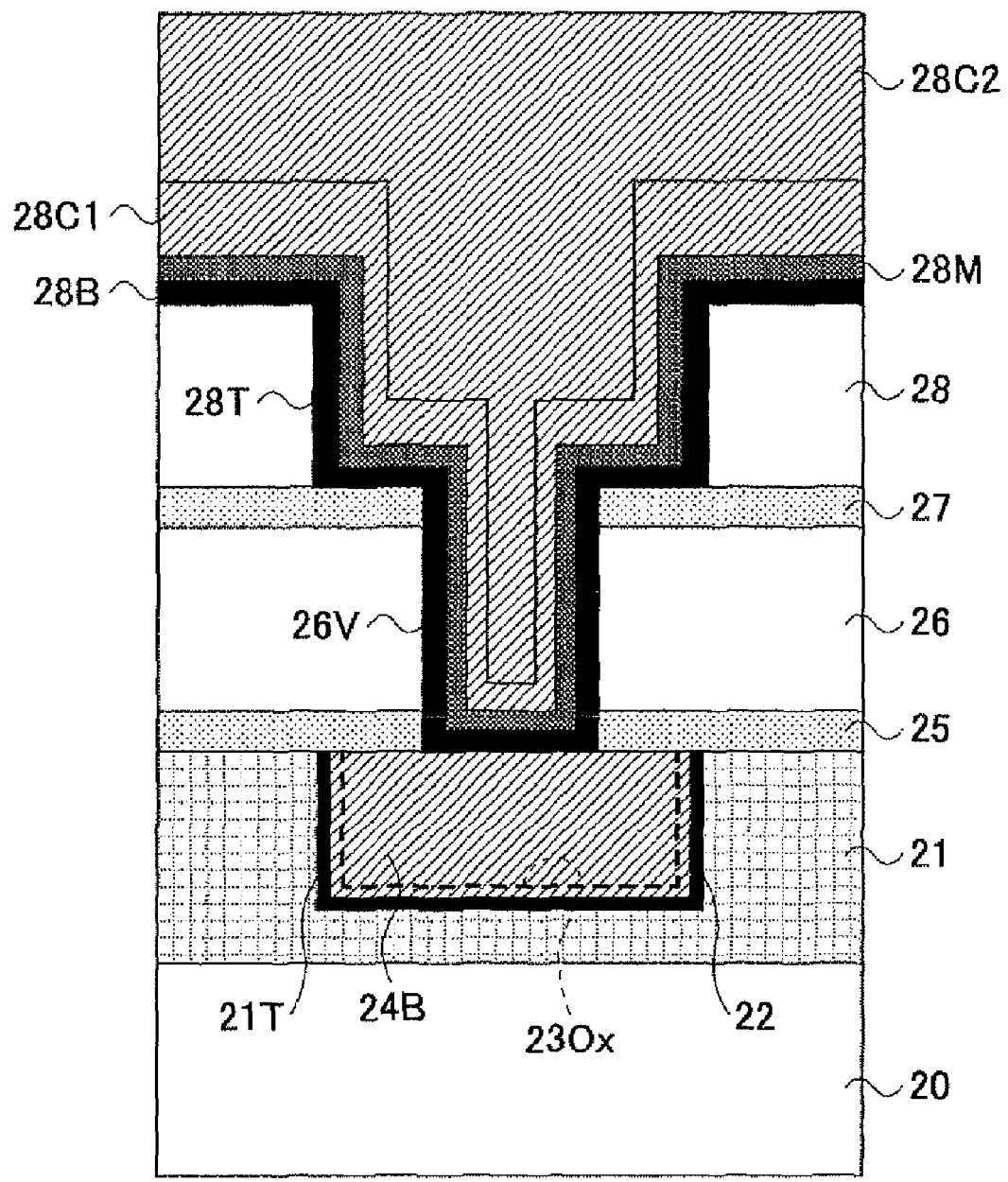

Further, as illustrated in FIG. 13H, a Cu layer 28C1 is formed on the structure of FIG. 13G by sputtering or CVD so as to cover the Cu—Mn—N alloy layer 28M. The Cu layer 28C1 is shaped to match the cross-sectional shapes of the trench 28T and the via hole 26V. The Cu layer 28C1 has a film thickness of 25 nm to 65 nm. Further, as illustrated in FIG. 13I, a Cu layer 28C2 is formed on the structure of FIG. 13H by electroplating using the Cu layer 28C1 as a plating seed layer, so as to fill in the trench 28T and the via hole 26V.

Figure 13J:
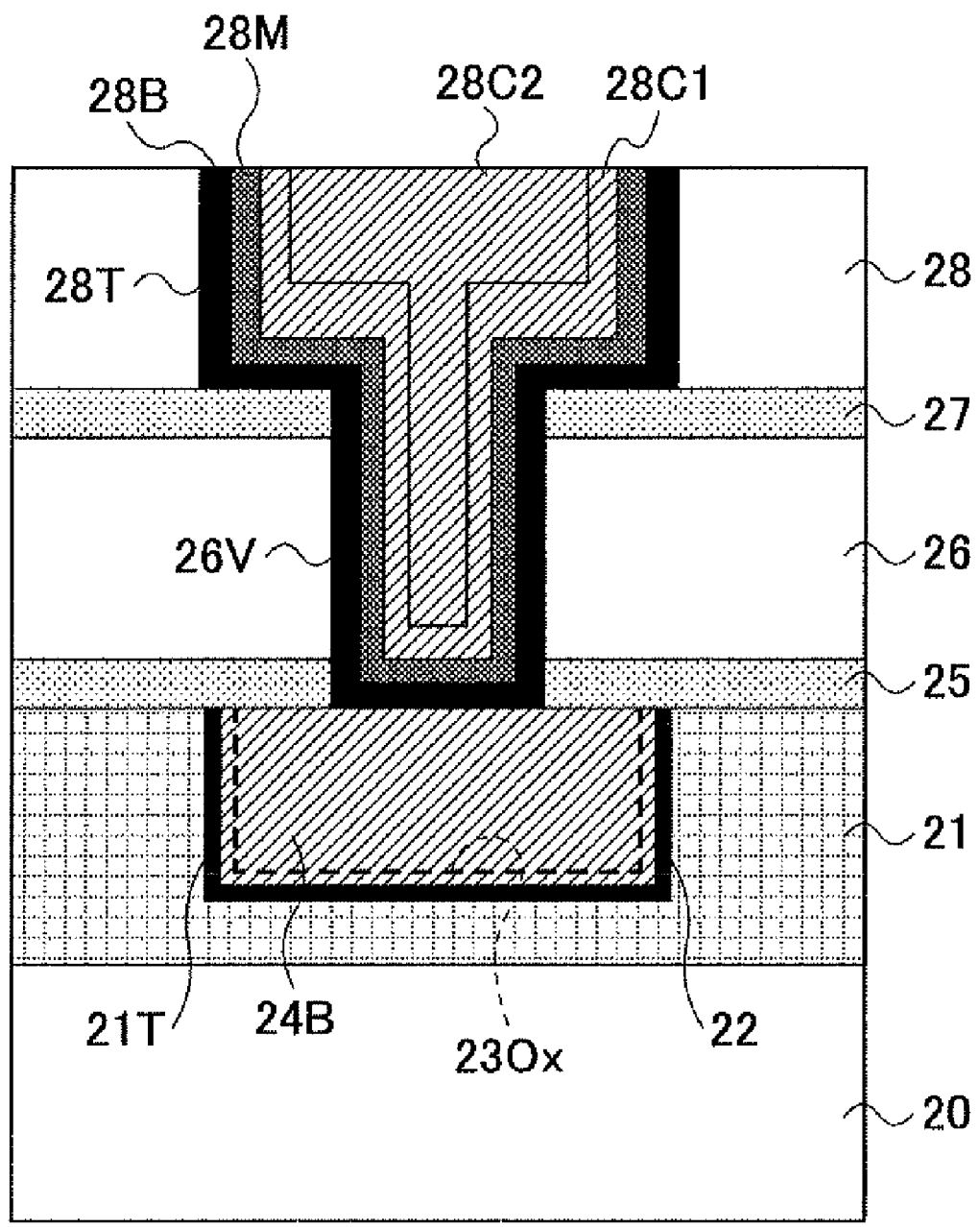
Figure 13K:
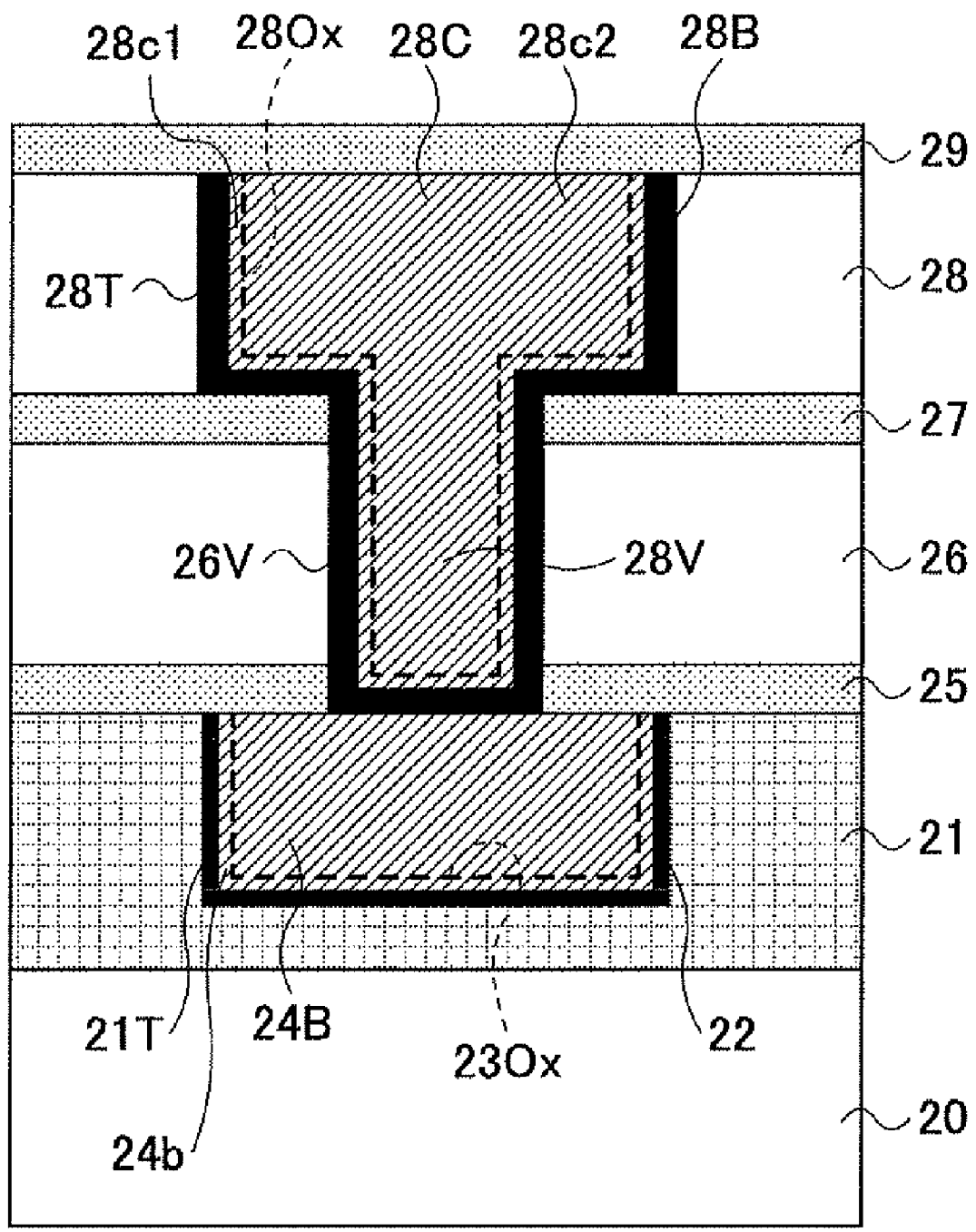

Further, as illustrated in FIG. 13J, the Cu layer 28C2, the Cu layer 28C1, the Cu—Mn—N alloy layer 28M, and the barrier metal film 28B on the interlayer insulating film 28 are polished and removed by CMP so that the surface of the interlayer insulating film 28 is exposed. Further, as illustrated in FIG. 13K, a cap layer 29 of a SiN film or SiC film is formed on the structure of FIG. 13J by plasma CVD performed typically at a substrate temperature of 400° C.

By the heat accompanying the formation of the cap layer 29, the Cu layer 28C1 and the Cu layer 28C2 are fused in the trench 28T and the via hole 26V so as to form a single Cu interconnection pattern 28C and a Cu via plug 28V extending continuously from the single Cu interconnection pattern 28C.

Further, by the heat accompanying the formation of the cap layer 29, Mn atoms in the Cu—Mn—N alloy layer 28M are caused to move into the barrier metal film 28B, so as to react with oxygen from the interlayer insulating films 26 and 28 and the etching stopper films 25 and 27 to be deposited stably in the form of a Mn oxide in the barrier metal film 28B, at the interface between the barrier metal film 28B and the Cu interconnection pattern 28C and/or the Cu via plug 28V, at the interface between the barrier metal film 28B and the interlayer insulating film 26 and/or the interlayer insulating film 28, at the interface between the barrier metal film 28B and the etching stopper film 25 and/or the etching stopper film 27, and/or at the interface between the Cu interconnection pattern 28C and the cap layer 29.

Further, if the barrier metal film 28B includes defects, such defects are self-repaired with the Mn oxide thus deposited.

Further, with this movement of Mn atoms in the Cu—Mn—N alloy layer 28M into the barrier metal film 28B, a Mn oxide layer 28Ox corresponding to the oxide layer formed on the surface of the Cu—Mn—N alloy layer 28M in the above-described process of FIG. 13G at a position corresponding to the original surface of the Cu—Mn—N alloy layer 28M at a distance corresponding to the film thickness of the original Cu—Mn—N alloy layer 28M from the surface of the barrier metal film 28B.

As a result, as illustrated in FIG. 13K, the Cu interconnection pattern 28C is composed of a Cu layer formed in a region 28c1 of the original Cu—Mn—N alloy layer 28M and a Cu layer formed in a region 28c2 of the original Cu layers 28C1 and 28C2.

According to this embodiment, the Cu—Mn—N alloy layer 28M includes N. Accordingly, even after execution of such a heat treatment process as in FIG. 13K, Mn atoms in the Cu—Mn—N layer 28M are prevented from being diffused deep into the Cu interconnection pattern 28C or the Cu via plug 28V, so that an increase in the resistance of the Cu interconnection pattern 28C or the Cu via plug 28V is reduced.

Figure 14:
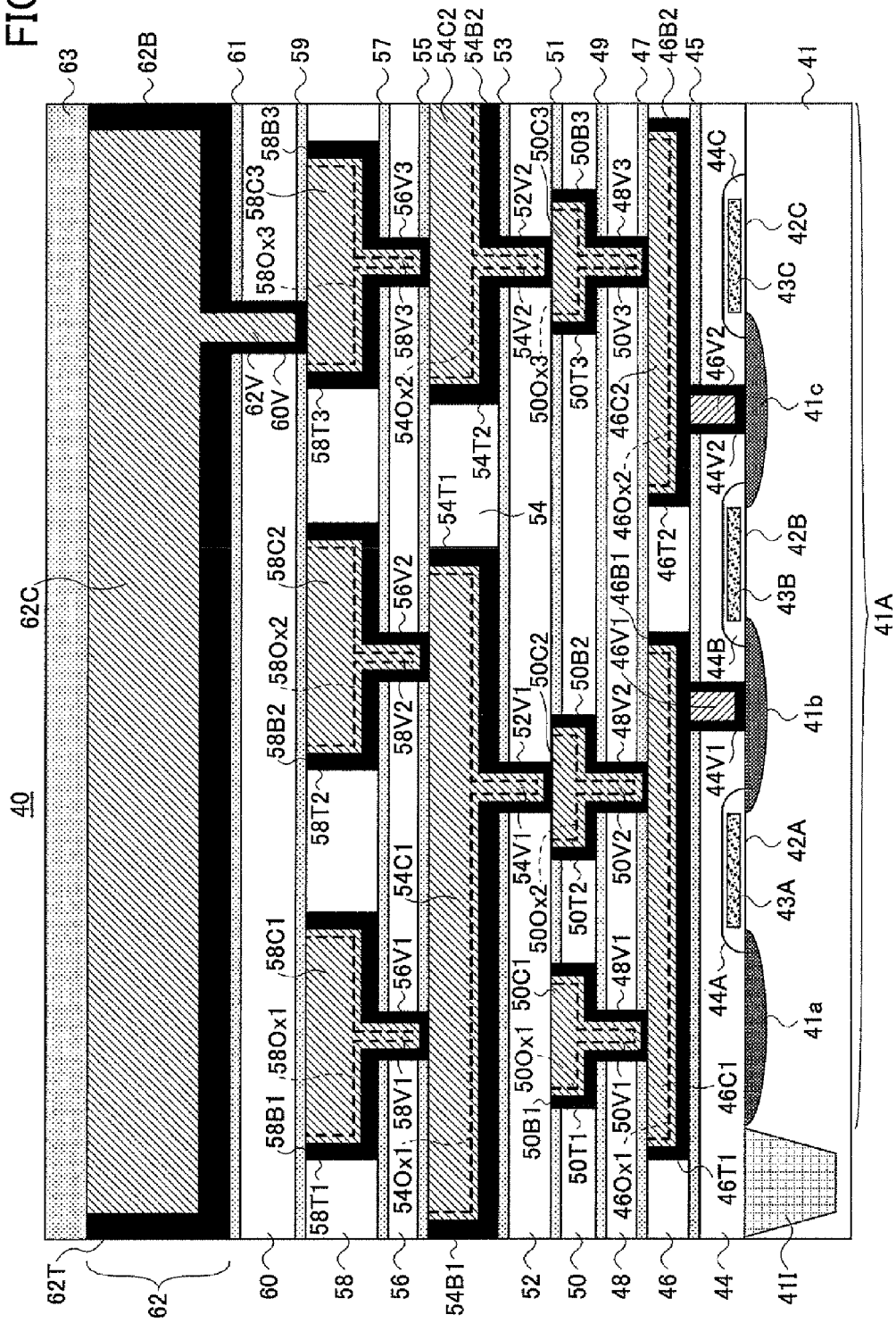
FIG. 14 is a diagram illustrating a configuration of the semiconductor device according to the third embodiment.

According to this embodiment, it is possible to manufacture a semiconductor device 40 illustrated in FIG. 14 by repeating the above-described process on a semiconductor substrate such as a silicon substrate on which a transistor is formed.

Referring to FIG. 14, a device region 41A is defined on a silicon substrate 41 by an isolation structure 41I. Gate electrodes 43A, 43B, and 43C are formed on the silicon substrate 41 through gate insulating films 42A, 42B, and 42C, respectively, in the device region 41A.

Further, p-type or n-type diffusion regions 41a, 41b, and 41c are formed adjacently to the gate electrodes 43A, 43B, and 43C in the silicon substrate 41 in the device region 41A.

The gate electrodes 43A, 43B, and 43C are covered with insulating films 44A, 44B, and 44C, respectively, of SiON or the like. Further, an insulating film 44 of a silicon oxide film or the like is formed on the silicon substrate 41 so as to cover the gate electrodes 43A through 43C through the insulating films 44A through 44C, respectively. Further, a via hole 44V1 exposing the diffusion region 41b and a via hole 44V2 exposing the diffusion region 41c are formed in the insulating film 44. The sidewall and bottom surfaces of these via holes 44V1 and 44V2 are covered continuously with barrier metal films 46B1 and 46B2, respectively, of, for example, Ti and TiN. Further, the via holes 44V1 and 44V2 are filled with via plugs 46V1 and 46V2, respectively, of tungsten.

An etching stopper film 45 of SiN or SiC is formed on the insulating film 44. An interlayer insulating film 46 of an inorganic or organic insulating film including a porous film is formed on the etching stopper film 45.

Trenches 46T1 and 46T2 are formed along predetermined interconnection patterns in the interlayer insulating film 46. Further, the via hole 44V1 that exposes the diffusion region 41b is formed in the insulating film 44 through the etching stopper film 45 so as to correspond to the trench 46T1. Further, the via hole 44V2 that exposes the diffusion region 41c is formed in the insulating film 44 through the etching stopper film 45 so as to correspond to the trench 46T2.

The sidewall and bottom surfaces of the trench 46T1 and the via hole 44V1 are covered with the barrier metal film 46B1 including at least one refractory metal element such as Ta, Ti, Zr, or Ru. The trench 46T1 and the via hole 44V1 are filled with a Cu interconnection pattern 46C1 and the via plug 46V1, respectively, through the barrier metal film 46B1.

Likewise, the sidewall and bottom surfaces of the trench 46T2 and the via hole 44V2 are covered with the barrier metal film 46B2 including at least one refractory metal element such as Ta, Ti, Zr, or Ru. The trench 46T2 and the via hole 44V2 are filled with a Cu interconnection pattern 46C2 and the via plug 46V2, respectively, through the barrier metal film 46B2.

An etching stopper film 46 of SiN or SiC is formed on the interlayer insulating film 46. An interlayer insulating film 48 of an inorganic or organic insulating film including a porous film is formed on the etching stopper film 47. An etching stopper film 49 of SiN or SiC is formed on the interlayer insulating film 48. An interlayer insulating film 50 of an inorganic or organic insulating film including a porous film is formed on the etching stopper film 49.

Trenches 50T1, 50T2, and 50T3 are formed in the interlayer insulating film 50 along predetermined interconnection patterns. Further, a via hole 48V1 that exposes the Cu interconnection pattern 46C1 is formed in the insulating film 48 through the etching stopper film 49 so as to correspond to the trench 50T1. Further, a via hole 48V2 that exposes the Cu interconnection pattern 46C1 is formed in the insulating film 48 through the etching stopper film 49 so as to correspond to the trench 50T2. Further, a via hole 48V3 that exposes the Cu interconnection pattern 46C2 is formed in the insulating film 48 through the etching stopper film 49 so as to correspond to the trench 50T3.

The sidewall and bottom surfaces of the trench 50T1 and the via hole 48V1 are covered continuously with a barrier metal film 50B1 continuously including at least one refractory metal element such as Ta, Ti, Zr, or Ru. The trench 50T1 and the via hole 48V1 are filled with a Cu interconnection pattern 50C1 and a Cu via plug 50V1 continuous with the Cu interconnection pattern 50C1, respectively, through the barrier metal film 50B1.

Likewise, the sidewall and bottom surfaces of the trench 50T2 and the via hole 48V2 are covered continuously with a barrier metal film 50B2 continuously including at least one refractory metal element such as Ta, Ti, Zr, or Ru. The trench 50T2 and the via hole 48V2 are filled with a Cu interconnection pattern 50C2 and a Cu via plug 50V2 continuous with the Cu interconnection pattern 50C2, respectively, through the barrier metal film 50B2.

Likewise, the sidewall and bottom surfaces of the trench 50T3 and the via hole 48V3 are covered continuously with a barrier metal film 50B3 continuously including at least one refractory metal element such as Ta, Ti, Zr, or Ru. The trench 50T3 and the via hole 48V3 are filled with a Cu interconnection pattern 50C3 and a Cu via plug 50V3 continuous with the Cu interconnection pattern 50C3, respectively, through the barrier metal film 50B3.

An etching stopper film 51 of SiN or SiC is formed on the interlayer insulating film 50. An interlayer insulating film 52 of an inorganic or organic insulating film including a porous film is formed on the etching stopper film 51.

An etching stopper film 53 of SiN or SiC is formed on the interlayer insulating film 52. An interlayer insulating film 54 of an inorganic or organic insulating film including a porous film is formed on the etching stopper film 53.

Trenches 54T1 and 50T2 are formed in the interlayer insulating film 54 along predetermined interconnection patterns. Further, a via hole 52V1 that exposes the Cu interconnection pattern 50C2 is formed in the insulating film 52 through the etching stopper film 53 so as to correspond to the trench 54T1. Further, a via hole 52V2 that exposes the Cu interconnection pattern 50C3 is formed in the insulating film 52 through the etching stopper film 53 so as to correspond to the trench 54T2.

The sidewall and bottom surfaces of the trench 54T1 and the via hole 52V1 are covered continuously with a barrier metal film 54B1 continuously including at least one refractory metal element such as Ta, Ti, Zr, or Ru. The trench 54T1 and the via hole 52V1 are filled with a Cu interconnection pattern 54C1 and a Cu via plug 54V1 continuous with the Cu interconnection pattern 54C1, respectively, through the barrier metal film 54B1.

Likewise, the sidewall and bottom surfaces of the trench 54T2 and the via hole 52V2 are covered continuously with a barrier metal film 54B2 continuously including at least one refractory metal element such as Ta, Ti, Zr, or Ru. The trench 54T2 and the via hole 52V2 are filled with a Cu interconnection pattern 54C2 and a Cu via plug 54V2 continuous with the Cu interconnection pattern 54C2, respectively, through the barrier metal film 54B2.

An etching stopper film 55 of SiN or SiC is formed on the interlayer insulating film 54. An interlayer insulating film 56 of an inorganic or organic insulating film including a porous film is formed on the etching stopper film 55. An etching stopper film 57 of SiN or SiC is formed on the interlayer insulating film 56. An interlayer insulating film 58 of an inorganic or organic insulating film including a porous film is formed on the etching stopper film 57.

Trenches 58T1, 58T2, and 58T3 are formed in the interlayer insulating film 58 along predetermined interconnection patterns. Further, a via hole 56V1 that exposes the Cu interconnection pattern 54C1 is formed in the insulating film 56 through the etching stopper film 57 so as to correspond to the trench 58T1. Further, a via hole 58V2 that exposes the Cu interconnection pattern 54C1 is formed in the insulating film 56 through the etching stopper film 57 so as to correspond to the trench 58T2. Likewise, a via hole 58V3 that exposes the Cu interconnection pattern 54C2 is formed in the insulating film 56 through the etching stopper film 57 so as to correspond to the trench 58T3.

The sidewall and bottom surfaces of the trench 58T1 and the via hole 56V1 are covered continuously with a barrier metal film 58B1 continuously including at least one refractory metal element such as Ta, Ti, Zr, or Ru. The trench 58T1 and the via hole 56V1 are filled with a Cu interconnection pattern 58C1 and a Cu via plug 58V1 continuous with the Cu interconnection pattern 58C1, respectively, through the barrier metal film 58B1.

Likewise, the sidewall and bottom surfaces of the trench 58T2 and the via hole 56V2 are covered continuously with a barrier metal film 58B2 continuously including at least one refractory metal element such as Ta, Ti, Zr, or Ru. The trench 58T2 and the via hole 56V2 are filled with a Cu interconnection pattern 58C2 and a Cu via plug 58V2 continuous with the Cu interconnection pattern 58C2, respectively, through the barrier metal film 58B2.

Likewise, the sidewall and bottom surfaces of the trench 58T3 and the via hole 56V3 are covered continuously with a barrier metal film 58B3 continuously including at least one refractory metal element such as Ta, Ti, Zr, or Ru. The trench 58T3 and the via hole 56V3 are filled with a Cu interconnection pattern 58C3 and a Cu via plug 58V3 continuous with the Cu interconnection pattern 58C3, respectively, through the barrier metal film 58B3.

An etching stopper film 59 of SiN or SiC is formed on the interlayer insulating film 58. An interlayer insulating film 60 of an inorganic or organic insulating film including a porous film is formed on the etching stopper film 59. An etching stopper film 61 of SiN or SiC is formed on the interlayer insulating film 60. Another interlayer insulating film 62 of $SiO_2$ or the like is formed on the etching stopper film 61.

A trench 62T is formed in the interlayer insulating film 62 along a predetermined interconnection pattern. Further, a via hole 60V that exposes the Cu interconnection pattern 58C3 is formed in the insulating film 60 through the etching stopper film 61 so as to correspond to the trench 62T.

The sidewall and bottom surfaces of the trench 62T and the via hole 60V are covered continuously with a barrier metal film 62B continuously including at least one refractory metal element such as Ta, Ti, Zr, or Ru. The trench 62T and the via hole 60V are filled with an interconnection pattern 62C formed of Al or Cu and a via plug 62V formed of Al or Cu to be continuous with the interconnection pattern 62C, respectively, through the barrier metal film 62B.

Further, a cap film 63 of SiN or the like is formed on the interlayer insulating film 62 by plasma CVD or the like so as to cover the interconnection pattern 62C.

According to the semiconductor device 40 of FIG. 14, when the Cu interconnection patterns 46C1 and 46C2, 50C1 through 50C3, 54C1 and 54C2, and 58C1 through 58C3 and the Cu via plugs 50V1 through 50V3, 54V1 and 54V2, and 58V1 through 58V3 are formed, Cu—Mn—N alloy layers corresponding to the above-described Cu—Mn—N alloy layer 23 or 28M are formed adjacently to their corresponding barrier metal films 46B1 and 46B2, 50B1 through 50B3, 54B1 and 54B2, and 58B1 through 58B3.

Therefore, at the time of formation of the cap film 63, Mn atoms in the Cu—Mn—N alloy layers move into the adjacent barrier metal films 46B1 and 46B2, 50B1 through 50B3, 54B1 and 54B2, and 58B1 through 58B3, so that a cross-sectional structure is obtained where Mn oxide thin layers 46Ox1 and 46Ox2, 50Ox1 through 50Ox3, 54Ox1 and 54Ox2, and 58Ox1 through 58Ox3 remain only at the surfaces of the corresponding original Cu—Mn—N alloy layers as indicated by broken lines in FIG. 14. Further, at this point, since the Cu—Mn—N alloy layers include N, the Mn atoms are prevented from being diffused deep into the Cu interconnection patterns 46C1 and 46C2, 50C1 through 50C3, 54C1 and 54C2, and 58C1 through 58C3 and/or the Cu via plugs 50V1 through 50V3, 54V1 and 54V2, and 58V1 through 58V3, so that an increase in the resistance of the Cu interconnection patterns 46C1 and 46C2, 50C1 through 50C3, 54C1 and 54C2, and 58C1 through 58C3 and/or the Cu via plugs 50V1 through 50V3, 54V1 and 54V2, and 58V1 through 58V3 is reduced.

According to this embodiment, in the process of FIG. 13H, the trench 28T and the via hole 26V may be filled with a Cu layer deposited by performing, for example, MOCVD one or more times. In this case, the trench 28T and the via hole 26V are filled with the Cu layer deposited by MOCVD, and the electroplating process of FIG. 13I may be omitted.

Further, according to this embodiment, heat treatment is performed after the Cu layer 28C1 in the trench 28T and the via hole 26V illustrated in FIG. 13H is formed by, for example, sputtering and the trench 28T and the via hole 26V are filled with the Cu layer 28C2 by electroplating.

Likewise, in manufacturing the semiconductor device 40 of FIG. 14, the same heat treatment is performed in the case of forming a Cu layer corresponding to the above-described Cu layer 28C1 by, for example, sputtering and further filling a trench and a via hole with a Cu layer using electroplating in forming the Cu interconnection patterns 46C1 and 46C2, 50C1 through 50C3, 54C1 and 54C2, and 58C1 through 58C3 and the Cu via plugs 50V1 through 50V3, 54V1 and 54V2, and 58V1 through 58V3.

In the above-described embodiments, a description is given of the technique of reducing Mn diffusion through introduction of N in the case of the self-repairing of defects of a barrier metal film using a Cu—Mn alloy layer. The above-described introduction of nitrogen is effective in reducing Al diffusion also in the case of the self-repairing of defects of a barrier metal film using a Cu—Al alloy layer. Further, in the above-described embodiments, the nitrogen-containing atmosphere for forming a Cu—Mn—N alloy layer may be one including an ammonia gas.

Thus, according to one aspect, a metal film formed on a refractory metal includes copper, manganese, and nitrogen. This makes it possible to reduce diffusion of manganese from the metal film into a copper film filling in a recess, so that it is possible to reduce an increase in the resistance of the copper film.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

What is claimed is:

1. A semiconductor device, comprising:
   an insulating film formed over a semiconductor substrate, the insulating film including oxygen;
   a recess formed in the insulating film;
   a refractory metal film formed on an inner wall of the recess;
   a metal film formed on the refractory metal film, the metal film including copper, manganese, and nitrogen; and
   a copper film formed on the metal film to fill in the recess, wherein a concentration of the manganese is higher in the metal film than in the copper film.

2. The semiconductor device as claimed in claim 1, wherein the metal film includes one or more layers.

3. The semiconductor device as claimed in claim 1, wherein the metal film has a thickness of approximately 1 nm to approximately 15 nm.

4. The semiconductor device as claimed in claim 1, wherein the refractory metal film includes at least one element selected from the group consisting of Ti, Ta, Zr, and Ru.

5. The semiconductor device as claimed in claim 1, wherein an amount of the nitrogen included in the metal film is larger on a first side near the copper film than on a second side opposite to the first side.

6. The semiconductor device as claimed in claim 1, wherein an accumulation part of the oxygen is formed at an interface between the metal film and the copper film, and
   the manganese is included mainly in a region within 300 nm from the accumulation part of the oxygen in the copper film.

* * * * *